United States Patent
Noda

(10) Patent No.: US 8,350,342 B2
(45) Date of Patent: Jan. 8, 2013

(54) SEMICONDUCTOR DEVICE

(75) Inventor: Taiji Noda, Osaka (JP)

(73) Assignee: Panasonic Corporation, Osaka (JP)

( * ) Notice: Subject to any disclaimer, the term of this patent is extended or adjusted under 35 U.S.C. 154(b) by 350 days.

(21) Appl. No.: 12/424,096

(22) Filed: Apr. 15, 2009

(65) Prior Publication Data

US 2009/0278209 A1 Nov. 12, 2009

(30) Foreign Application Priority Data

May 7, 2008 (JP) .................................. 2008-121176

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......... 257/408; 257/E29.266; 257/E21.437
(58) Field of Classification Search .................... 257/408
See application file for complete search history.

(56) References Cited

U.S. PATENT DOCUMENTS

| | | | |
|---|---|---|---|
| 6,806,149 B2 | 10/2004 | Bu et al. | |
| 7,279,758 B1 * | 10/2007 | Li et al. ........................ | 257/408 |
| 2002/0058385 A1 | 5/2002 | Noda | |
| 2002/0121654 A1 | 9/2002 | Yamamoto | |
| 2004/0004250 A1 | 1/2004 | Momiyama et al. | |
| 2004/0173843 A1 | 9/2004 | Noda | |
| 2005/0112854 A1 | 5/2005 | Ito et al. | |
| 2005/0227463 A1 | 10/2005 | Ito et al. | |
| 2008/0142885 A1 | 6/2008 | Mineji | |
| 2008/0293204 A1 * | 11/2008 | Nieh et al. ..................... | 438/291 |
| 2009/0294875 A1 * | 12/2009 | Ye et al. ........................ | 257/408 |

FOREIGN PATENT DOCUMENTS

| JP | 2000-156291 | 6/2000 |
|---|---|---|
| JP | 2002-203962 | 7/2002 |
| JP | 2002-329864 | 11/2002 |
| JP | 3523627 B2 | 4/2004 |
| JP | 2004-235603 | 8/2004 |
| JP | 2004-289125 | 10/2004 |
| JP | 2005-136382 | 5/2005 |
| JP | 2005-322893 | 11/2005 |

OTHER PUBLICATIONS

Pawlak B.J. et al., "Suppression of phosphorous diffusion by carbon co-implantation," Applied Physics Letters, vol. 89, p. 062102 (2006).

(Continued)

*Primary Examiner* — Thien F Tran
(74) *Attorney, Agent, or Firm* — McDermott Will & Emery LLP

(57) ABSTRACT

A semiconductor device includes a gate electrode provided on a semiconductor region with a gate insulating film being interposed therebetween, extension diffusion layers provided in regions on both sides of the gate electrode of the semiconductor region, a first-conductivity type first impurity being diffused in the extension diffusion layers, and source and drain diffusion layers provided in regions farther outside than the respective extension diffusion layers of the semiconductor region and having junction depths deeper than the respective extension diffusion layers. At least one of the extension diffusion layers on both sides of the gate electrode contains carbon.

16 Claims, 13 Drawing Sheets

OTHER PUBLICATIONS

Downey D. et al., "Effect of fluorine on the diffusion of boron on ion implanted Si," Applied Physics Letters, Aug. 31, 1998, vol. 73, No. 9, pp. 1263-1265.

Pawlak B.J. et al., "Effect of amorphization and carbon co-doping on activation and diffusion of boron in silicon," Applied Physics Letters, vol. 89, p. 062110 (2006).

Severi S. et al., "Optimization of Sub-Melt Laser Anneal: Performance and Reliability," IEDM 2006, p. 859, (2006).

Momiyama, Y., et al., "Extension Engineering using Carbon co-Implantation Technology for Low Power CMOS Design with Phosphorus- and Boron-Extension", the 7th International Workshop on Junction Technology 2007, pp. 63-64.

* cited by examiner

SEMICONDUCTOR DEVICE

CROSS REFERENCE TO RELATED APPLICATIONS

This application claims priority under 35 U.S.C. §119(a) on Patent Application No. 2008-121176 filed in Japan on May 7, 2008, the entire contents of which are hereby incorporated by reference.

BACKGROUND OF THE INVENTION

The present disclosure relates to a Metal Insulator Semiconductor (MIS) type semiconductor device that has a shallow junction depth and a low-resistant diffusion layer, and can be further miniaturized, and a method for fabricating the semiconductor device.

As the scale of integration of semiconductor integrated circuits increases, there is a demand for further miniaturization of a MIS transistor. To achieve this, the MIS transistor needs to have an extension diffusion layer with a shallow junction depth and a low resistance.

Hereinafter, a method for fabricating a conventional MIS transistor will be described with reference to the accompanying drawings.

FIGS. 13A to 13D and 14A to 14D show cross-sectional views of a structure of the conventional MIS transistor in the order in which steps of a fabrication method thereof are performed.

Initially, as shown in FIG. 13A, an N-type impurity (e.g., arsenic (As) ions) is implanted into a semiconductor substrate 1 made of P-type silicon at an implantation energy of about 140 keV and an implantation dose of about $1\times10^{12}/cm^2$. Thereafter, phosphorus (P) ions are implanted into an upper portion of the semiconductor substrate 1 at an implantation energy of about 260 keV and an implantation dose of about $4\times10^{12}/cm^2$ for the first ion implantation and at an implantation energy of about 540 keV and an implantation dose of about $1\times10^{13}/cm^2$ for the second ion implantation. By performing predetermined thermal processing immediately after the ion implantation, an N-type well 2 and an N-type channel diffusion layer 3 are formed in a channel region of the semiconductor substrate 1.

Next, as shown in FIG. 13B, a gate insulating film 4 having a film thickness of about 2.2 nm is formed on the semiconductor substrate 1. A polycrystal silicon film having a film thickness of about 200 nm is formed on the gate insulating film 4. Thereafter, the polycrystal silicon film is subjected to patterning to form a gate electrode 5. In this case, the gate insulating film 4 may have the same pattern as that of the gate electrode 5.

Next, as shown in FIG. 13C, ion implantation of an N-type impurity (e.g., As ions) is performed at an implantation energy of about 130 keV and an implantation dose of about $7\times10^{13}/cm^2$, to form pocket impurity implanted layers 6A.

Next, as shown in FIG. 13D, ion implantation of fluorine is performed at an implantation energy of about 25 keV and an implantation dose of about $5\times10^{14}/cm^2$, to perform so-called preamorphization that allows formation of P-type extension diffusion layers having shallow junction depths.

Next, as shown in FIG. 14A, ion implantation of a P-type impurity (e.g., boron (B) ions) is performed at an implantation energy of about 1.5 keV and an implantation dose of about $5\times10^{14}/cm^2$ using the gate electrode 5 as a mask, to form extension impurity implanted layers 7A.

Next, as shown in FIG. 14B, for example, an insulating film made of silicon nitride having a film thickness of about 50 nm is deposited. The deposited insulating film is then subjected to anisotropic etching having a higher etch rate in a vertical direction, so that sidewalls 8 made of silicon nitride are formed on side surfaces of the gate electrode 5.

Next, as shown in FIG. 14C, ion implantation of a P-type impurity (e.g., boron difluoride ($BF_2$) ions) is performed at an implantation energy of about 30 keV and an implantation dose of about $3\times10^{15}/cm^2$ using the gate electrode 5 and the sidewalls 8 as a mask, to form P-type impurity implanted layers 9A.

Next, as shown in FIG. 14D, the semiconductor substrate 1 is subjected to thermal processing at high temperature and for a short time, to form P-type extension diffusion layers 7 having shallow junction depths from the respective extension impurity implanted layers 7A in an upper portion of the semiconductor substrate 1 below the respective sidewalls 8, and N-type pocket diffusion layers 6 from the respective pocket impurity implanted layers 6A below the respective P-type extension diffusion layers 7. Also, P-type source and drain diffusion layers 9 having deeper junction depths than those of the respective N-type pocket diffusion layers 6 are formed from the respective P-type impurity implanted layers 9A in the semiconductor substrate 1 farther outside than the respective sidewalls 8.

As described above, in the conventional MIS semiconductor device fabricating method, as shown in FIG. 14A, the implantation energy of boron ions used for extension implantation to form the P-type extension diffusion layer 7 is reduced so that the P-type extension diffusion layer 7 has a shallow junction.

SUMMARY OF THE INVENTION

However, in the conventional semiconductor device fabricating method, when a large dose of boron (B) with low energy is implanted into the semiconductor substrate 1, Transient Enhanced Diffusion (hereinafter referred to as TED) occurs, so that boron is diffused in a depth direction of the semiconductor substrate 1. Therefore, in this case, there is a problem that a desired impurity profile cannot be obtained in the P-type extension diffusion layer 7. As used herein, TED refers to an abnormal diffusion phenomenon that impurity atoms are accelerated by interaction with excess point defects (interstitial silicon or an atomic vacancy) existing in a silicon substrate. Excess point defects are often generated mainly by implantation damage during ion implantation. Even if the implantation energy of ion implantation is reduced so as to obtain a shallower junction, the TED of an implanted dopant becomes significant, which makes it difficult to obtain a desired shallow and low-resistant diffusion layer only by implantation of a single element with low energy.

Fluorine (F) is known as an element that suppresses the diffusion of boron, which is a typical P-type dopant. For example, D. Downey et al., Appl. Phys. Lett. Vol 73, p 1263 (1998) (hereinafter referred to Document 1) and the like have reported that the presence of fluorine in a silicon substrate suppresses the TED of boron in some cases. In Document 1, preamorphized silicon substrates are subjected to boron (B) ion implantation and boron difluoride ($BF_2$) implantation, and are then compared in terms of boron diffusion. In this case, amorphization (preamorphization) of the silicon substrates is performed before implantation of the desired impurity ions into the silicon substrates, thereby eliminating the influence of a difference in implantation damage between B ion implantation and $BF_2$ ion implantation on the comparison. Thereafter, an influence of fluorine on boron diffusion is examined.

On the other hand, if fluorine is implanted into the gate electrode 5 and the gate insulating film 4, boron is diffused from the gate electrode 5 to the N-type channel diffusion layer 3, and moreover, the gate insulating film 4 has variations in film thickness, leading to a deterioration in reliability. Such a problem with a semiconductor fabrication process is described in, for example, IEDM 2006, p. 859 (2006). Therefore, for example, if the dose of fluorine is reduced, the reliability deterioration can be suppressed. However, the reduction of the fluorine dose decreases the suppression effect of fluorine on the TED of boron.

It is known to utilize fluorine implantation in a transistor fabrication process, as described in, for example, Japanese Unexamined Patent Application Publication No. 2000-156291 (hereinafter referred to as Document 2). Note that Document 2 describes a semiconductor device fabricating method that employs fluorine implantation so as to reduce variations in threshold voltage that occurs when a semiconductor device is used for a long period of time. Specifically, fluorine is diffused into a region immediately below the gate electrode so as to distribute fluorine at an interface between the gate insulating film and the silicon substrate. Therefore, in Document 2, fluorine is not used so as to suppress the diffusion of an impurity in the extension diffusion layer.

As described above, in conventional semiconductor device fabricating methods, it is difficult to form the extension diffusion layer essential for miniaturization of a transistor while maintaining the concentration of a predetermined impurity.

In view of the aforementioned conventional problems, an object of the present disclosure is to achieve an extension diffusion layer having a shallower junction and a lower resistance that is required for miniaturization of a transistor, thereby providing a miniature device having high drive capability.

To achieve the object, the present disclosure provides a semiconductor device fabricating method in which an extension formation region is amorphized, followed by carbon implantation and annealing, before ion implantation with low energy into the extension formation region.

Specifically, a semiconductor device according to the present disclosure includes a gate electrode provided on a semiconductor region with a gate insulating film being interposed therebetween, extension diffusion layers provided in regions on both sides of the gate electrode of the semiconductor region, a first-conductivity type first impurity being diffused in the extension diffusion layers, and source and drain diffusion layers provided in regions farther outside than the respective extension diffusion layers of the semiconductor region and having junction depths deeper than the respective extension diffusion layers. At least one of the extension diffusion layers on both sides of the gate electrode contains carbon.

According to the semiconductor device of the present disclosure, the implanted carbon removes excess point defects in the semiconductor region during annealing of the extension diffusion layers. As a result, excess point defects generated by ion implantation are reduced, so that the TED of an impurity atom, such as boron, phosphorus or the like, is suppressed, and therefore, the junction depth of each extension diffusion layer can be kept shallow.

In the semiconductor device of the present disclosure, the source and drain diffusion layers preferably contain fluorine.

In the semiconductor device of the present disclosure, the carbon is preferably added to only one of the extension diffusion layers.

In the semiconductor device of the present disclosure, the carbon is preferably added to both of the extension diffusion layers.

In the semiconductor device of the present disclosure, insulating offset spacers are preferably provided on side surfaces of the gate electrode, and the offset spacers preferably do not contain fluorine.

In this case, the offset spacers preferably contain carbon.

Also, in this case, insulating sidewalls are preferably provided on side surfaces in a gate length direction of the gate electrode with the respective offset spacers being interposed therebetween, and the sidewalls preferably do not contain fluorine.

In the semiconductor device of the present disclosure, germanium preferably remains in the source and drain diffusion layers.

A method for fabricating a semiconductor device according to the present disclosure includes a first step of forming a gate electrode on a semiconductor region with a gate insulating film being interposed therebetween, a second step of implanting a first impurity ion to the semiconductor region using the gate electrode as a mask, to amorphize the semiconductor region, a third step of selectively implanting carbon or a molecule ion containing carbon into the amorphized semiconductor region, a fourth step of, after the third step, implanting a first-conductivity type second impurity ion into the semiconductor region using the gate electrode as a mask, and a fifth step of, after the fourth step, subjecting the semiconductor region to first thermal processing, to form first-conductivity type extension diffusion layers in regions on both sides of the gate electrode of an upper portion of the semiconductor region, the second impurity ion being diffused in the first-conductivity type extension diffusion layers.

According to the semiconductor device fabricating method of the present disclosure, the semiconductor region is amorphized by implanting the first impurity ion into the semiconductor region using the gate electrode as a mask, and carbon or a carbon-containing molecule is selectively implanted into the amorphized semiconductor region. Thereafter, the first-conductivity type second impurity ion is implanted into the semiconductor region using the gate electrode as a mask. Carbon reacts with point defects that cause the TED of impurities to be quickly diffused, so that the amount of excess point defects that interact with the second impurity ion is reduced. As a result, the TED of the second impurity ion is suppressed, so that an extension diffusion layer having a shallow junction can be achieved. In addition, it is known that, when the semiconductor region is made of silicon and the second impurity ion is a boron ion, interstitial silicon and boron react with each other to form a boron-interstitial silicon cluster, so that boron is inactivated. When point defects are reduced, the generation of boron-interstitial silicon clusters is suppressed. Therefore, the inactivation of boron can be simultaneously suppressed. As a result, a shallow and low-resistant extension diffusion layer can be achieved.

In the semiconductor device fabricating method of the present disclosure, the second and third steps are preferably simultaneously performed.

In the semiconductor device fabricating method of the present disclosure, the second step is preferably performed while masking one of the regions on both sides of the gate electrode of the semiconductor region.

In the semiconductor device fabricating method of the present disclosure, the second step is preferably performed by implanting the first impurity ion in a direction oblique to the normal to an upper surface of the semiconductor region, to amorphize only one of the regions on both sides of the gate electrode of the semiconductor region.

The semiconductor device fabricating method of the present disclosure preferably further includes a sixth step of forming sidewalls made of an insulating film on side surfaces of the gate electrode, a seventh step of implanting an impurity ion for prevention of diffusion into the semiconductor region using the gate electrode and the sidewalls as a mask, and an eighth step of, after the seventh step, implanting a first-conductivity type third impurity ion using the gate electrode and the sidewalls as a mask. The sixth to eighth steps are performed between the fourth step and the fifth step. The fifth step preferably includes forming first-conductivity type source and drain diffusion layers in regions farther outside than the respective extension diffusion layers by the first thermal processing. The third impurity ion is diffused in the first-conductivity type source and drain diffusion layers, and the first-conductivity type source and drain diffusion layers have junction surfaces deeper than the respective extension diffusion layers.

Thus, by co-implanting different impurity ions into the extension diffusion layers and the source and drain diffusion layers having junction depths larger than those of the respective extension diffusion layers, shallow and low-resistant extension diffusion layers can be formed. In addition, adverse effects, i.e., a deterioration in reliability and an increase in junction leakage, can be reduced.

The semiconductor device fabricating method of the present disclosure preferably further includes a ninth step of removing the sidewalls. The ninth step is performed between the eighth step and the fifth step.

Also, when the seventh step of implanting an impurity ion for prevention of diffusion into the semiconductor region is provided, the impurity ion for prevention of diffusion preferably includes fluorine or a molecule ion containing fluorine.

The semiconductor device fabricating method of the present disclosure preferably further includes a tenth step of forming insulating offset spacers on side surfaces of the gate electrode. The tenth step is performed between the first step and the second step.

The semiconductor device fabricating method of the present disclosure preferably further includes an eleventh step of implanting a second-conductivity type fourth impurity into the semiconductor region using the gate electrode as a mask. The eleventh step is performed between the fourth step and the fifth step. The fifth step preferably includes forming second-conductivity type pocket diffusion layers in regions below the respective extension diffusion layers by the first thermal processing, wherein the fourth impurity is diffused in the second-conductivity type pocket diffusion layers.

In the semiconductor device fabricating method of the present disclosure, the first thermal processing is preferably millisecond annealing that has a short annealing duration and can increase temperature to high temperature, or rapid thermal processing that has a temperature increasing rate of 100° C./s or more and a temperature decreasing rate of 80° C./s or more, has a heating temperature of 850° C. or more and 1050° C. or less, and maintains the heating temperature for a maximum of 10 seconds or does not maintain the heating temperature.

In this case, laser annealing or flash annealing can be used as the millisecond annealing.

In the semiconductor device fabricating method of the present disclosure, germanium, silicon, argon, krypton, xenon, or carbon can be used as the first impurity ion.

In the semiconductor device fabricating method of the present disclosure, boron, boron fluoride, a boron cluster, or indium can be used as the second impurity ion.

As described above, according to the semiconductor device of the present disclosure and the method of fabrication thereof, an extension diffusion layer having a shallower junction and a lower resistance that is required for further miniaturization can be achieved, and a miniature device having high drive capability can be obtained. Also, extension diffusion layers can be easily caused to have asymmetric impurity profiles. For example, by performing co-implantation with respect to only one (e.g., a source region) of source and drain regions, the source region is caused to have a shallow and steep impurity profile, so that the concentration gradient of carriers between the source region and a channel region can be caused to large. As a result, the drive capability of the transistor can be improved. Also, in this case, the drain region has an impurity profile deeper than that of the source region, so that the occurrence of hot carriers can be suppressed.

DETAILED DESCRIPTION OF THE PREFERRED EMBODIMENTS

First Embodiment

A first illustrative embodiment will be described with reference to the drawings.

Figure 1:
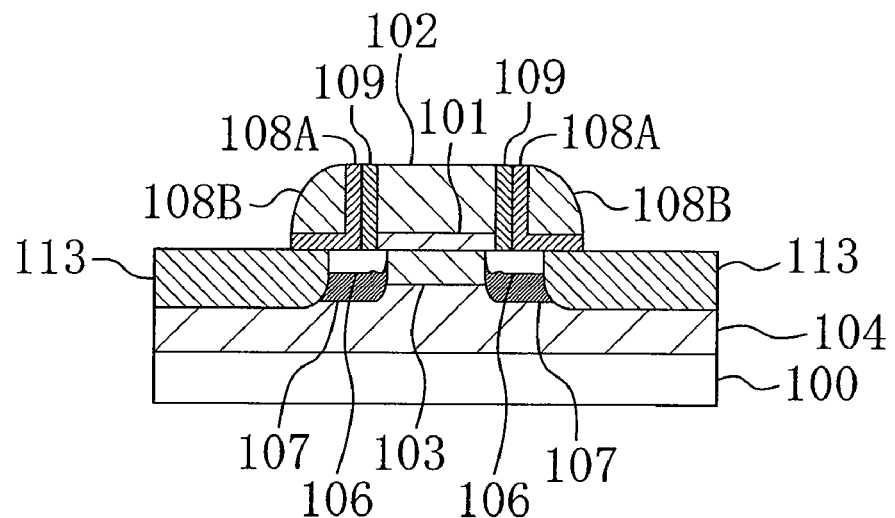
FIG. 1 is a cross-sectional view of a semiconductor device according to a first illustrative embodiment.

FIG. 1 is a cross-sectional view showing a structure of a MIS transistor that is a semiconductor device according to the first illustrative embodiment.

As shown in FIG. 1, for example, a gate electrode 102 made of polysilicon or a metal (metal gate) is formed on a main surface of a semiconductor substrate 100 made of P-type silicon (Si) with a gate insulating film 101 made of silicon oxide ($SiO_2$) being interposed therebetween. An N-type channel diffusion layer 103 in which, for example, arsenic (As) is diffused, and an N-type well 104 in which, for example, arsenic (As) and phosphorus (P) are diffused and which has a junction depth larger than that of the N-type channel diffusion layer 103, are formed in an upper portion of the semiconductor substrate 100.

P-type extension high-concentration diffusion layers 106 in which a P-type impurity (e.g., boron (B)) is diffused and which has a relatively shallow junction, and N-type pocket diffusion layers 107 which are located below the respective P-type extension high-concentration diffusion layers 106 and in which an N-type impurity (e.g., arsenic (As)) is diffused, are formed in respective regions in a gate length direction of the N-type channel diffusion layer 103 in which a source and a drain are formed.

The P-type extension high-concentration diffusion layer 106 contains carbon (C). The P-type extension high-concentration diffusion layer 106 is also a crystalline layer that does not include a residual defect layer, such as End-Of-Range (EOR) defects or the like. As used herein, the EOR defect refers to a defect layer that is formed in a region immediately below an amorphous/crystal (a/c) interface as it was before thermal processing, when the amorphized semiconductor substrate 100 made of silicon is subjected to the thermal processing.

In the present disclosure, the diffusion of boron is suppressed using carbon, so that the P-type extension high-concentration diffusion layer 106 maintains a shallow and steep impurity profile and a high activation concentration. Therefore, it is possible to achieve a miniature device that includes an extension diffusion layer having a shallow junction depth and a low resistance, and has high drive capability. Also, the contained carbon has the effect of suppressing the occurrence of a residual (EOR) defect.

Also, since the crystalline layer in which the generation of a residual defect layer is suppressed is used in the extension formation region of the semiconductor substrate 100 so as to suppress the TED of boron, the occurrence of junction leakage due to a residual defect layer can also be suppressed.

Also, P-type source and drain diffusion layers 113 that are connected to the respective P-type extension high-concentration diffusion layers 106 and have junction depths larger than those of the respective P-type extension high-concentration diffusion layers 106 are formed in respective regions in the semiconductor substrate 100 farther outside than the respective P-type extension high-concentration diffusion layers 106. The P-type source and drain diffusion layers 113 contain carbon (C).

Insulating offset spacers 109 are formed on both side surfaces of the gate electrode 102. The offset spacers 109 contain carbon. Moreover, first sidewalls 108A having an L-shaped cross-section are formed that extend from outer side surfaces of the respective offset spacers 109 to upper portions of inner end portions of the respective P-type source and drain diffusion layers 113 on the semiconductor substrate 100. Also, insulating second sidewalls 108B are formed farther outside than the respective first sidewalls 108A. The first sidewalls 108A and the second sidewalls 108B do not contain carbon.

Although arsenic ions are used as an impurity for the N-type channel diffusion layer 103 in the first embodiment, ions of an N-type element that have a larger mass than that of arsenic ions may be used instead. Alternatively, both arsenic ions and ions of an N-type element that have a larger mass than that of arsenic ions may be used.

Also, although a P-channel MIS transistor is used as a semiconductor device in the first embodiment, an N-channel MIS transistor may be instead used. In the case of the N-channel MIS transistor, phosphorus (P) ions, arsenic (As) ions, or ions of a Group V element, such as antimony (Sb) ions, bismuth (Bi) ions or the like, which have a larger mass than that of arsenic ions can be used as an N-type impurity ion for the extension diffusion layer. Also, in the case of the N-channel MIS transistor, for example, boron (B) ions, ions of a Group III element, such as indium (In) ions or the like, which have a larger mass than that of boron ions, or a combination thereof can be used in the P-type pocket diffusion layer. As a result, carbon suppresses TED in the P-type pocket diffusion layer, so that variations in the threshold voltage due to the pocket profile can be suppressed.

Variation of First Embodiment

Figure 2:
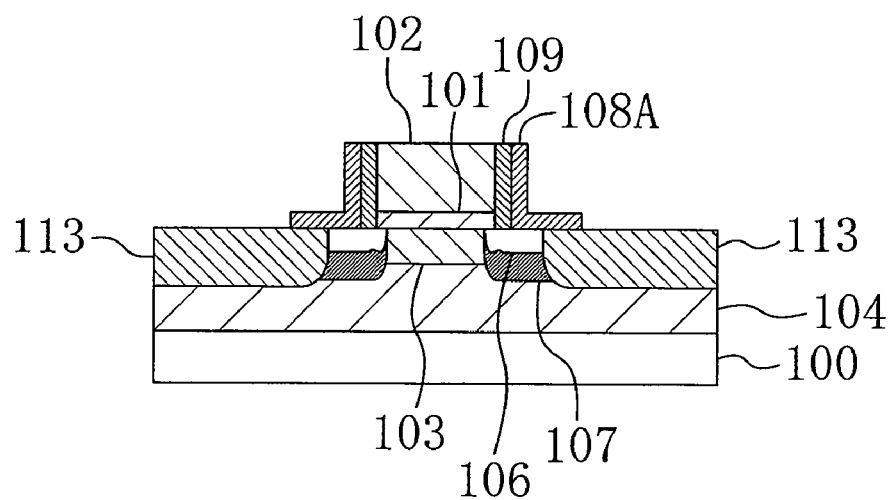
FIG. 2 is a cross-sectional view of a semiconductor device according to a variation of the first illustrative embodiment.

FIG. 2 is a cross-sectional view showing a structure of a semiconductor device according to a variation of the first illustrative embodiment. As shown in FIG. 2, in the semiconductor device of this variation, first sidewalls 108A and second sidewalls 108B contain fluorine, while P-type source and drain diffusion layers 113 contain fluorine (F) and carbon (C).

Also, in the semiconductor device of this variation, the second sidewalls 108B are removed. Thus, the second sidewalls 108B are removed before thermal processing for forming the P-type source and drain diffusion layers 113. Therefore, it is possible to prevent fluorine from being diffused from the second sidewalls 108B into P-type extension high-concentration diffusion layers 106 and the P-type source and drain diffusion layers 113 during thermal diffusion.

Hereinafter, a method for fabricating the semiconductor device of FIG. 1 will be described with reference to the drawings.

FIGS. 3A to 3E, 4A to 4D and 5A to 5C are cross-sectional views of a structure of the MIS transistor of the first illustrative embodiment in the order in which steps of a fabrication method thereof are performed.

Figure 3A:
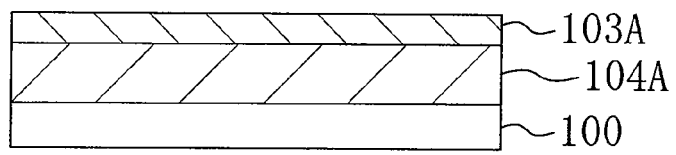
FIGS. 3A to 3E are cross-sectional views showing a method of fabrication of the semiconductor device of the first illustrative embodiment in the order in which steps thereof are performed.

Initially, as shown in FIG. 3A, N-type impurity ions (e.g., phosphorus (P) ions) are implanted into a channel formation region of the semiconductor substrate 100 made of P-type silicon at an implantation energy of about 260 keV and an implantation dose of about $4\times10^{12}/cm^2$ for the first ion implantation and an implantation energy of about 540 keV and an implantation dose of about $1\times10^{13}/cm^2$ for the second ion implantation, thereby forming an N-type well impurity implanted layer 104A. Thereafter, arsenic (As) ions are implanted into the semiconductor substrate 100 at an implantation energy of about 140 keV and an implantation dose of about $5 \times 10^{12}/cm^2$, thereby forming an N-type channel impurity implanted layer 103A in an upper portion of the N-type well impurity implanted layer 104A. In this case, it is preferable that a silicon oxide film be deposited on a surface of the semiconductor substrate 100 before ion implantation. Note that the order in which the well impurity implanted layer 104A and the N-type channel impurity implanted layer 103A are formed is not particularly limited.

Figure 3B:
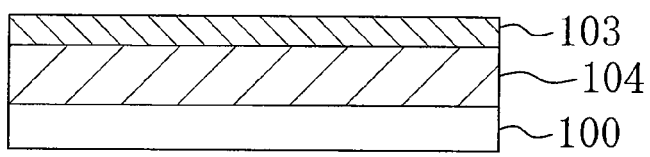

Next, as shown in FIG. 3B, the temperature of the ion-implanted semiconductor substrate 100 is increased to about 850° C. to 1050° C. at a temperature increasing rate of about 100° C./s or more, preferably about 200° C./s, and then the peak temperature is maintained for a maximum of about 10 seconds or is not maintained, which is first rapid thermal processing (Rapid Thermal Annealing (RTA)). By the first rapid thermal processing, the N-type channel diffusion layer 103 and the N-type well 104 are formed in an upper portion of the semiconductor substrate 100. Note that the rapid thermal processing without maintaining the peak temperature refers to thermal processing in which thermal processing temperature is decreased immediately after it reaches a peak temperature.

Figure 3C:
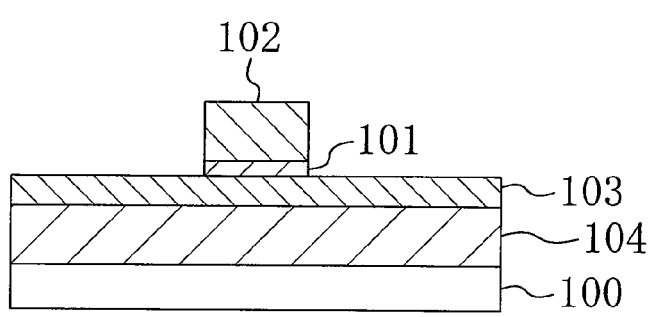

Next, as shown in FIG. 3C, the gate insulating film 101 made of silicon oxide having a film thickness of about 1.5 nm is selectively formed on the semiconductor substrate 100, and the gate electrode 102 made of polysilicon having a film thickness of about 100 nm is selectively formed on the gate insulating film 101. Instead of silicon oxide, the gate insulating film 101 may be made of a high-k insulating film, such as silicon oxynitride (SiON), hafnium oxide (HfO$_x$), hafnium silicon oxynitride (HfSiON) or the like. Also, instead of polysilicon, the gate electrode 102 may be made of a metal, a multilayer film of polysilicon and a metal, polysilicon an upper portion of which is silicided, or fully-silicided polysilicon.

Figure 3D:
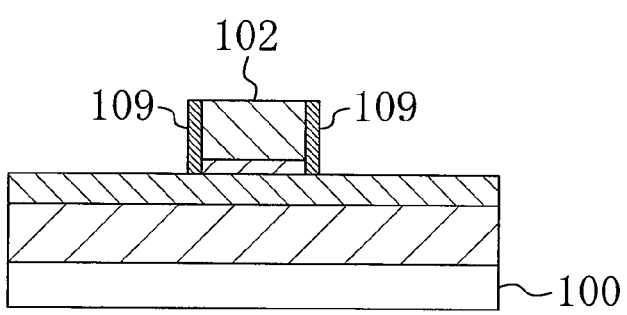

Next, as shown in FIG. 3D, an insulating film made of silicon oxide having a film thickness of about 8 nm is deposited, followed by anisotropic etching, to form the offset spacers 109 having a final thickness of about 4 nm on both side surfaces of the gate electrode 102 and the gate insulating film 101. Instead of silicon oxide, the offset spacer 109 may be made of a high-k insulating film, such as silicon nitride (SiN), HfO$_2$ or the like.

Figure 3E:
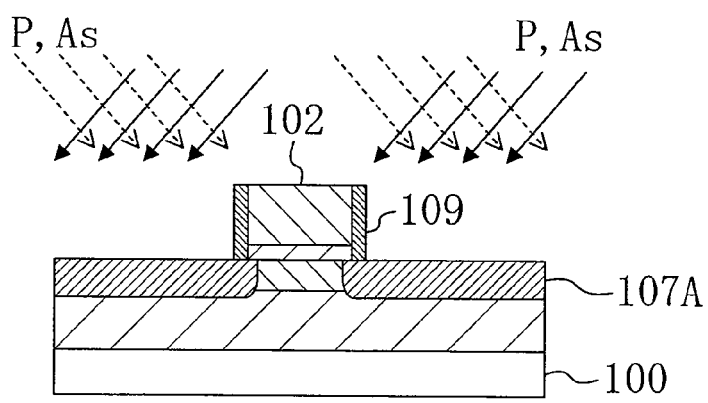

Next, as shown in FIG. 3E, an N-type impurity (e.g., phosphorus (P) ions) is implanted into the semiconductor substrate 100 by angled implantation at an implantation energy of about 50 keV and an implantation dose of about $2 \times 10^{13}/cm^2$ using the offset spacers 109 and the gate electrode 102 as a mask. Next, an N-type impurity (e.g., arsenic (As) ions) is implanted by angled implantation at an implantation energy of about 80 keV and an implantation dose of about $1 \times 10^{13}/cm^2$, thereby forming N-type pocket impurity implanted layers 107A. The order in which P ions and As ions are implanted is not particularly limited.

Figure 4A:
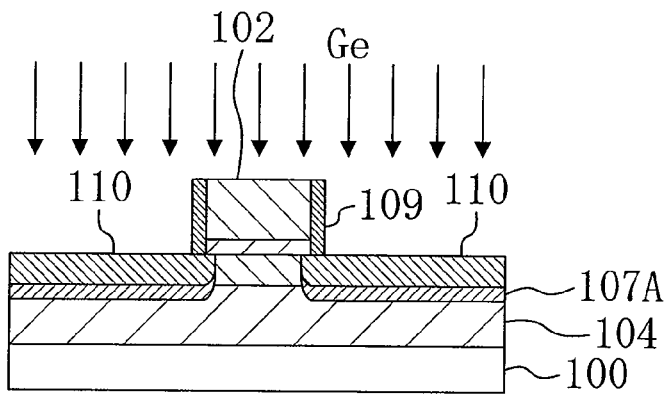
FIGS. 4A to 4D are cross-sectional views showing the method of fabrication of the semiconductor device of the first illustrative embodiment in the order in which steps thereof are performed.

Next, as shown in FIG. 4A, germanium (Ge) ions are implanted into the semiconductor substrate 100 at an implantation energy of about 10 keV and an implantation dose of about $5 \times 10^{14}/cm^2$ using the offset spacers 109 and the gate electrode 102 as a mask, thereby selectively forming amorphous layers 110 in the semiconductor substrate 100. Instead of germanium, the amorphous layer 110 may be made of silicon (Si), argon (Ar), krypton (Kr), xenon (Xe), carbon (C) or the like.

Figure 4B:
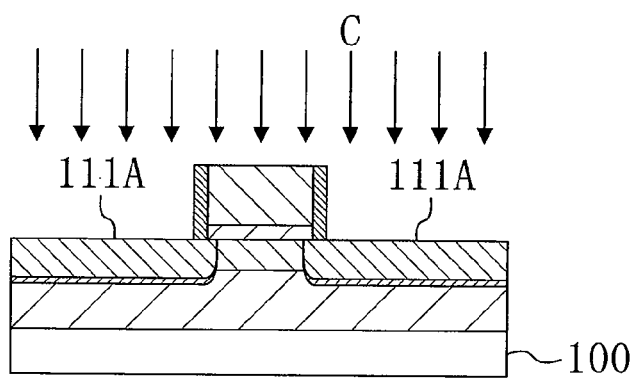

Next, as shown in FIG. 4B, in the presence of the amorphous layers 110 thus formed, carbon (C) ions are implanted into the semiconductor substrate 100 at an implantation energy of about 5 keV and an implantation dose of about $1 \times 10^{15}/cm^2$ using the offset spacers 109 and the gate electrode 102 as a mask, thereby forming carbon implanted layers 111A. Note that the carbon ion implantation may be performed with an implantation energy within the range of about 1 keV to 10 keV and an implantation dose within the range of about $1 \times 10^{14}/cm^2$ to $3 \times 10^{15}/cm^2$, for example. In this case, instead of carbon ions, ions of a molecule containing carbon (e.g., $C_5H_5$, $C_7H_7$, etc.) may be used. Also, nitrogen ions may be used instead of carbon ions that are impurity ions for prevention of diffusion. Also, if carbon ions or ions of a molecule containing carbon are used to form the amorphous layer 110 instead of germanium, the step of forming the amorphous layer 110 and the step of forming the carbon implanted layer 111A can be simultaneously performed. Also, ions having a relatively large mass number (e.g., antimony (Sb) ions) may be used as an N-type pocket impurity so that the semiconductor substrate 100 is amorphized during pocket implantation.

Figure 4C:
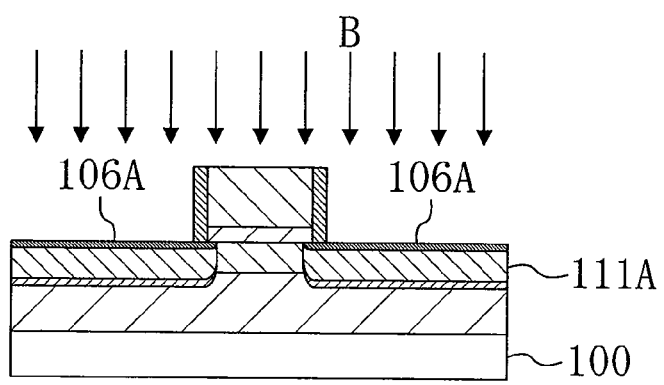

Next, as shown in FIG. 4C, a P-type impurity (e.g., boron (B) ions) is implanted into the semiconductor substrate 100 at an implantation energy of about 0.5 keV and an implantation dose of about $5 \times 10^{14}/cm^2$ using the offset spacers 109 and the gate electrode 102 as a mask, thereby forming first P-type impurity implanted layers 106A in upper portions of the respective carbon implanted layer 111A. Note that, instead of boron, boron difluoride (BF$_2$), a boron cluster (e.g., $B_{18}H_x$, $B_{10}H_x$, etc.), or indium (In) may be used.

Figure 6A:
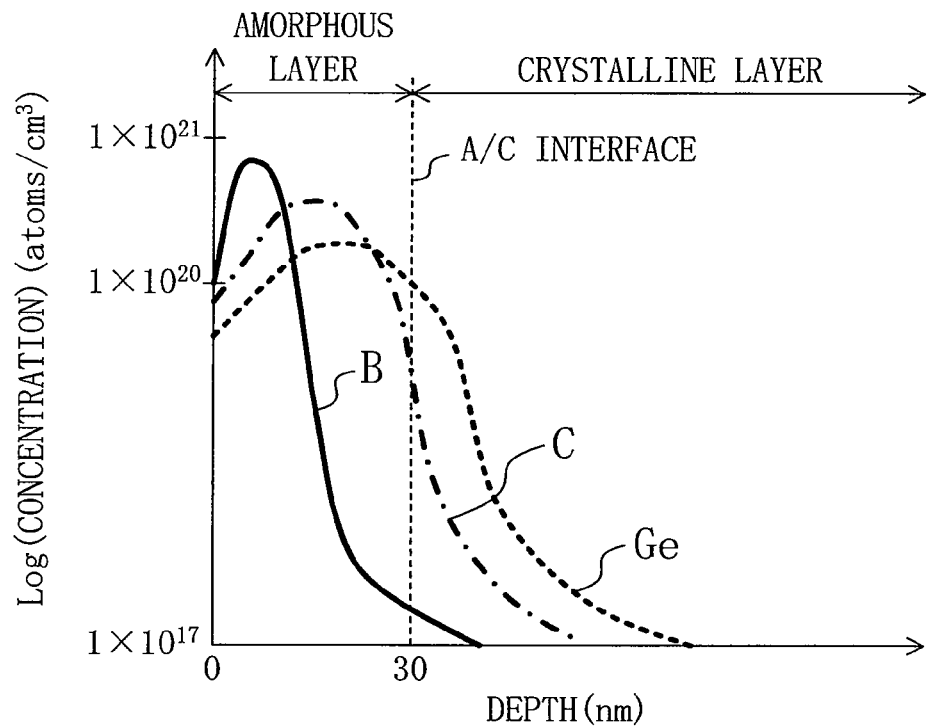
FIGS. 6A and 6B are impurity profiles in a depth direction of an extension formation region in the first illustrative embodiment, immediately after implantation and after thermal processing, respectively.

FIG. 6A shows a concentration distribution (impurity profile) in a depth direction of each impurity (boron (B), carbon (C) and germanium (Ge)) immediately after implantation of the impurity on a logarithmic scale. As shown in FIG. 6A, the amorphous layer 110 has a depth of about 30 nm under the germanium ion implantation conditions of the first embodiment.

Figure 4D:
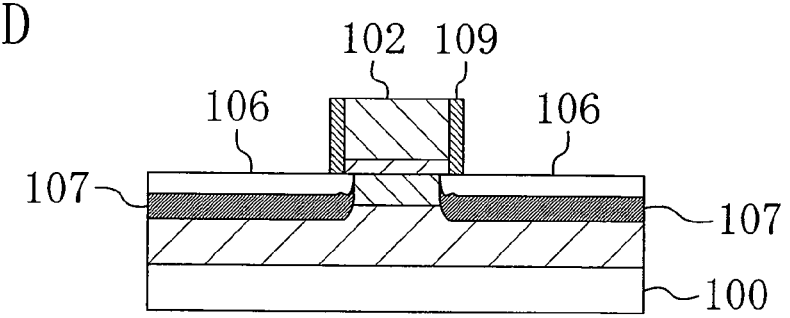

Next, the temperature of the semiconductor substrate 100 is increased to about 1200° C. to 1350° C. by, for example, laser annealing, and is then maintained in the vicinity of the peak temperature for about 1 ms (second rapid thermal processing). By the second rapid thermal processing, as shown in FIG. 4D, the P-type extension high-concentration diffusion layers 106 in which boron ions are diffused and have relatively shallow junction surfaces, and the N-type pocket diffusion layers 107 in which phosphorus ions and arsenic ions contained in the N-type pocket impurity implanted layer 107A are diffused, are formed in respective regions on both sides of the gate electrode 102 of the semiconductor substrate 100. Instead of laser annealing, so-called millisecond annealing (MSA), such as flash lamp annealing or the like, may be used as the second rapid thermal processing of the order of milliseconds. Alternatively, as the second rapid thermal processing, the temperature of the semiconductor substrate 100 may be increased to about 850° C. to 1050° C. at a temperature increasing rate of about 200° C./s, and then the peak temperature may be maintained for a maximum of about 10 seconds, or may not be maintained (e.g., spike-RTA with low temperature).

Figure 6B:
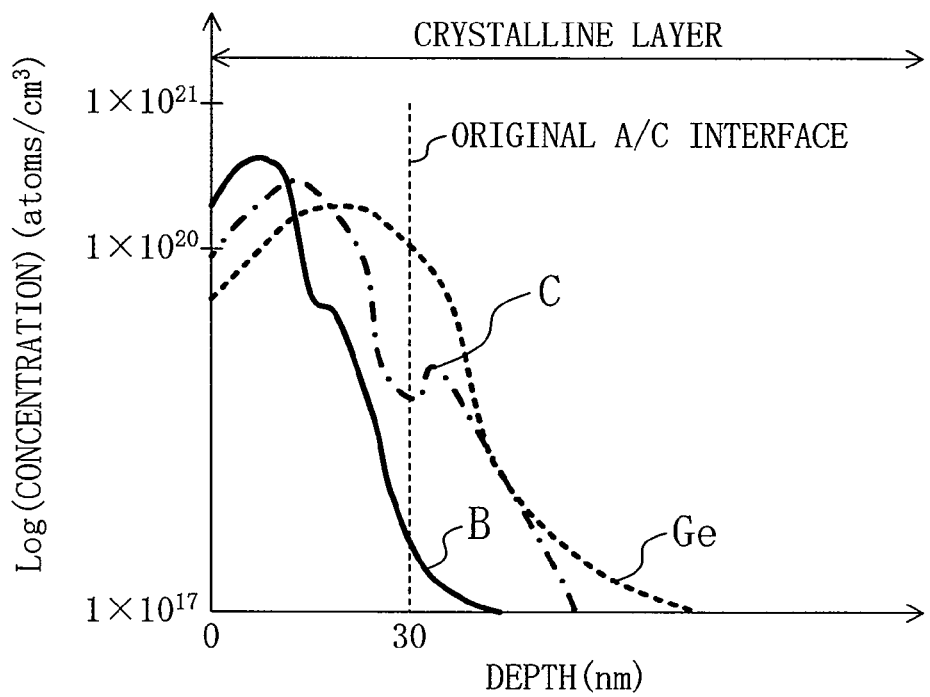

FIG. 6B shows concentration distributions in the depth direction of impurities (B, C, Ge) in the P-type extension high-concentration diffusion layer 106 formed by the second rapid thermal processing on a logarithmic scale. After the second rapid thermal processing, the amorphous layer 110 formed during the germanium ion implantation is restored into a crystalline layer. Boron is diffused, so that its peak is located at a slightly deeper position than that as it was immediately after the ion implantation. Carbon has a first peak due to carbon clusters in the vicinity of a concentration peak position as it was immediately after the ion implantation, and a segregated second peak in the vicinity of a position where the amorphous/crystal (a/c) interface was originally provided. Germanium has substantially the same concentration distribution as it was immediately after the ion implantation.

Figure 5A:
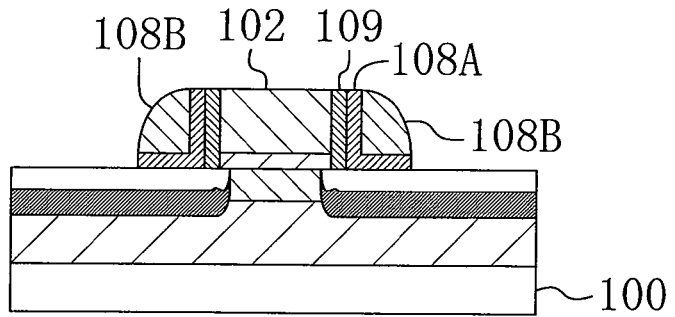
FIGS. 5A to 5C are cross-sectional views showing the method of fabrication of the semiconductor device of the first illustrative embodiment in the order in which steps thereof are performed.

Next, a first insulating film made of silicon oxide having a film thickness of about 10 nm and a second insulating film made of silicon nitride having a film thickness of about 40 nm are successively deposited on an entire surface of the semiconductor substrate 100, including the offset spacers 109 and the gate electrode 102, by, for example, Chemical Vapor Deposition (CVD). Thereafter, the deposited first and second insulating films are subjected to anisotropic etching, thereby forming the first sidewalls 108A from the first insulating film and the second sidewalls 108B from the second insulating film, on side surfaces in the gate length direction of the gate electrode 102, as shown in FIG. 5A. The second sidewalls 108B may be made of silicon oxide or a multilayer film made of silicon oxide and silicon nitride, instead of silicon nitride.

Figure 5B:
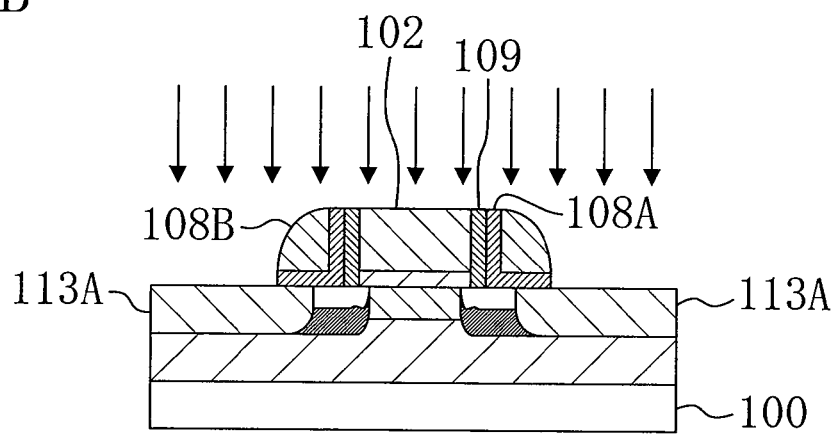

Next, as shown in FIG. 5B, boron ions (P-type impurity) are implanted into the semiconductor substrate 100 at an implantation energy of about 3 keV and an implantation dose of about $3 \times 10^{15}/cm^2$ using the gate electrode 102, the offset spacers 109, the first sidewalls 108A and the second sidewalls 108B as a mask, thereby forming second P-type impurity implanted layers 113A.

Figure 5C:
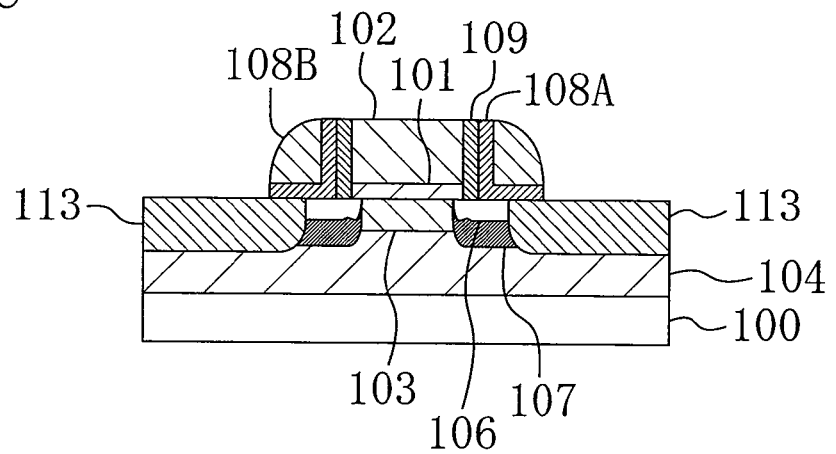

Next, as shown in FIG. 5C, the temperature of the semiconductor substrate 100 is increased to about 1200° C. to 1350° C. by, for example, laser annealing, and is then maintained in the vicinity of the peak temperature for about 1 ms (third rapid thermal processing). By the third rapid thermal processing, the P-type high-concentration impurity diffusion layers (P-type source and drain diffusion layers) 113 in which boron ions are diffused and which are connected to the respective P-type extension high-concentration diffusion layers 106 and have junction surfaces deeper than the respective P-type extension high-concentration diffusion layers 106, are formed in respective regions directly below and farther outside than the sidewalls 108A and 108B of the semiconductor substrate 100. Instead of laser annealing, so-called millisecond annealing (MSA), such as flash lamp annealing or the like, may be used as the third rapid thermal processing of the order of milliseconds. Alternatively, as the third rapid thermal processing, the temperature the semiconductor substrate 100 may be increased to about 850° C. to 1050° C. at a temperature increasing rate of about 200° C./s to 250° C./s, and then the peak temperature may be maintained for a maximum of about 10 seconds, or may not be maintained (e.g., spike-RTA).

Note that the second rapid thermal processing of FIG. 4D may be removed, and in this case, the third rapid thermal processing also serves as the second rapid thermal processing.

As described above, according to the first embodiment, the semiconductor substrate 100 is amorphized with germanium in the step of FIG. 4A, and thereafter, carbon is implanted as an impurity for prevention of diffusion in the step of FIG. 4B, before ion implantation for formation of an extension diffusion layer is performed with low energy in the step of forming the first P-type impurity implanted layer 106A of FIG. 4C. Carbon has the effect of suppressing the Transient Enhanced Diffusion (TED) of impurity atoms (see, for example, Appl. Phys. Lett. Vol. 89, p. 062110 (2006), Appl. Phys. Lett. Vol. 89, p. 062102, (2006), etc.). Carbon significantly suppresses the diffusion of boron and phosphorus, and therefore, is effective to formation of a shallow diffusion layer in each of a P-type field effect transistor (pFET) and an N-type field effect transistor (nFET).

According to this embodiment, carbon is co-implanted into regions in which the P-type extension high-concentration diffusion layers 106 are to be formed. Therefore, carbon plays a role in removing excess point defects in the semiconductor substrate 100 during thermal processing. As a result, excess point defects generated by ion implantation are reduced, so that the TED of an impurity atom, such as boron, phosphorus or the like, is suppressed, and therefore, the junction depth of each diffusion layer can be kept shallow.

Moreover, carbon is used as an impurity ion for prevention of diffusion instead of fluorine. Therefore, it is possible to prevent boron from being diffused from the gate electrode 102 to the N-type channel diffusion layer 103 due to fluorine, and also, prevent a problem that the reliability of the gate insulating film 101 is reduced due to variations in the film thickness thereof.

Thus, by performing carbon implantation under the aforementioned conditions, it is possible to reliably form the low-resistant P-type extension high-concentration diffusion layer 106 that has a shallow junction and suppresses the junction leakage, and also suppresses the increase of the resistance due to dose loss.

Note that only phosphorus (P) may be used for the N-type pocket diffusion layer 107. The use of phosphorus enhances the diffusion prevention effect of carbon ions as compared to when arsenic (As) is used.

(Variation of Fabrication Method)

FIGS. 7A to 7D are cross-sectional views showing a structure of the semiconductor device of the first embodiment in the order in which major steps of a variation of the fabrication method of the first embodiment are performed.

Figure 7A:
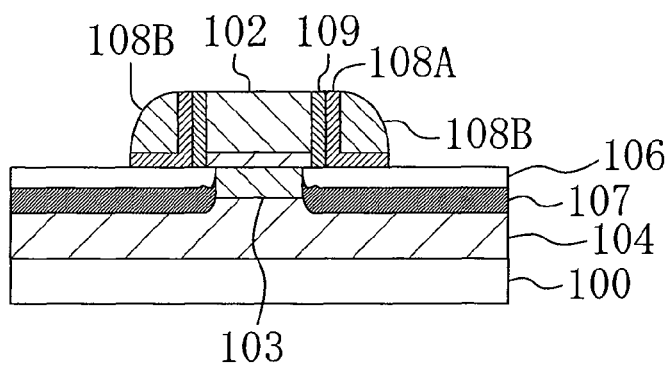
FIGS. 7A to 7D are cross-sectional views showing a variation of the method of fabrication of the semiconductor device of the first illustrative embodiment in the order in which steps thereof are performed.

In the step of FIG. 7A, for example, the first sidewalls 108A made of silicon oxide and the second sidewalls 108B of silicon nitride are formed so that they have etch rates different from each other.

Figure 7B:
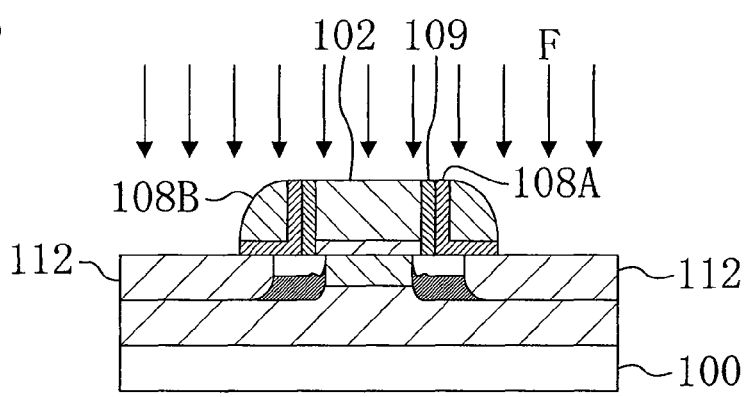

Next, as shown in FIG. 7B, fluorine (F) ions are implanted into the semiconductor substrate 100 at an implantation energy of about 8 keV and an implantation dose of about $1 \times 10^{15}/cm^2$ using the gate electrode 102, the offset spacers 109, the first sidewalls 108A and the second sidewalls 108B as a mask, thereby forming fluorine implanted layers 112 for amorphizing source and drain formation regions in the semiconductor substrate 100. Instead of fluorine, ions of a molecule containing fluorine, such as $F_2$, $GeF_2$, $BF_3$ or the like, can be used as ions for preventing diffusion of an impurity.

Figure 7C:
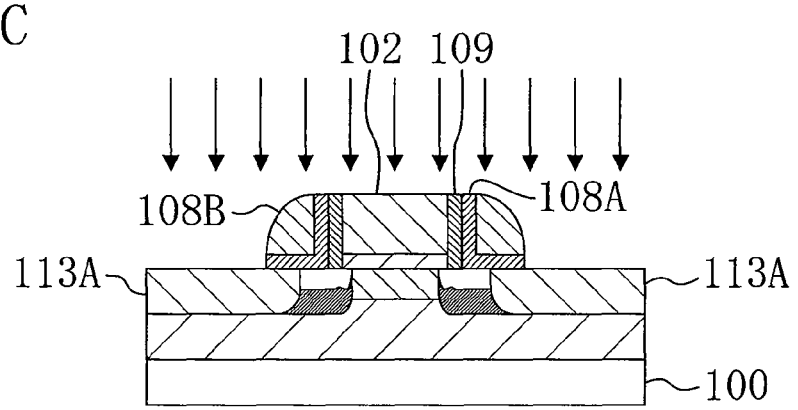

Next, as shown in FIG. 7C, boron ions (P-type impurity) are implanted into the semiconductor substrate 100 at an implantation energy of about 3 keV and an implantation dose of about $3 \times 10^{15}/cm^2$ using the gate electrode 102, the offset spacers 109, the first sidewalls 108A and the second sidewalls 108B as a mask, thereby forming the second P-type impurity implanted layers 113A.

Figure 7D:
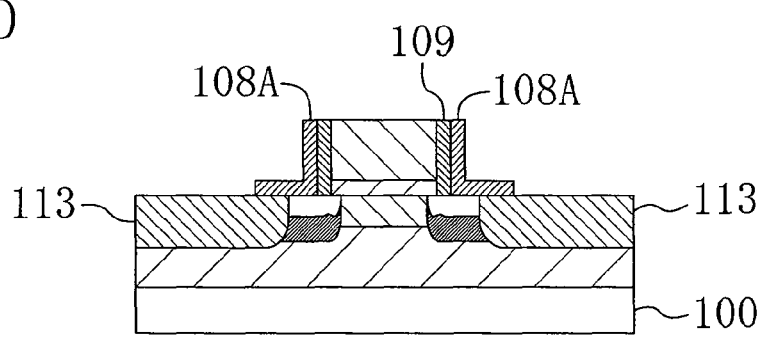

Next, as shown in FIG. 7D, the second sidewalls 108B are selectively removed. Thereafter, the semiconductor substrate 100 is subjected to third rapid thermal processing (e.g., laser annealing, etc.), thereby forming the P-type source and drain diffusion layers 113 in respective regions farther outside than the respective first sidewalls 108A of the semiconductor substrate 100. In the P-type source and drain diffusion layers 113, boron ions are diffused, and have junction surfaces deeper than the respective P-type extension high-concentration diffusion layers 106.

Figure 8A:
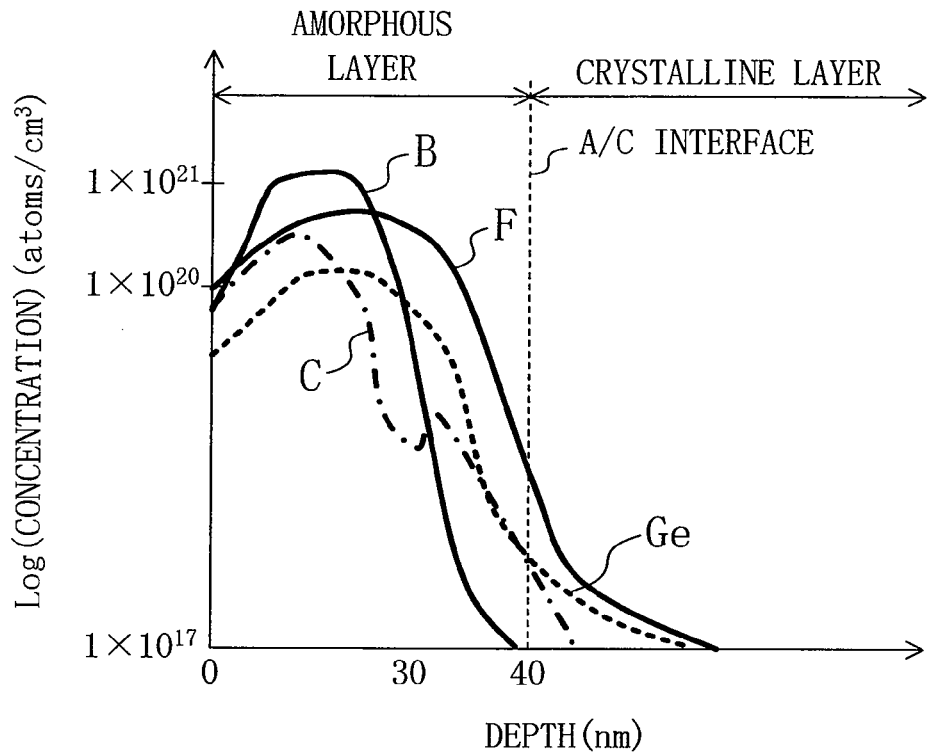
FIGS. 8A and 8B are impurity profiles in the depth direction of source and drain formation regions in the first illustrative embodiment, immediately after boron implantation and after thermal processing, respectively.

FIG. 8A shows concentration distributions in the depth direction of impurities in the source and drain formation regions immediately after boron ions are implanted into the source and drain formation regions (logarithmic scale). By implantation of fluorine ions as an impurity for prevention of diffusion under the implantation conditions of this variation, an amorphous layer of about 40 nm is formed.

Figure 8B:
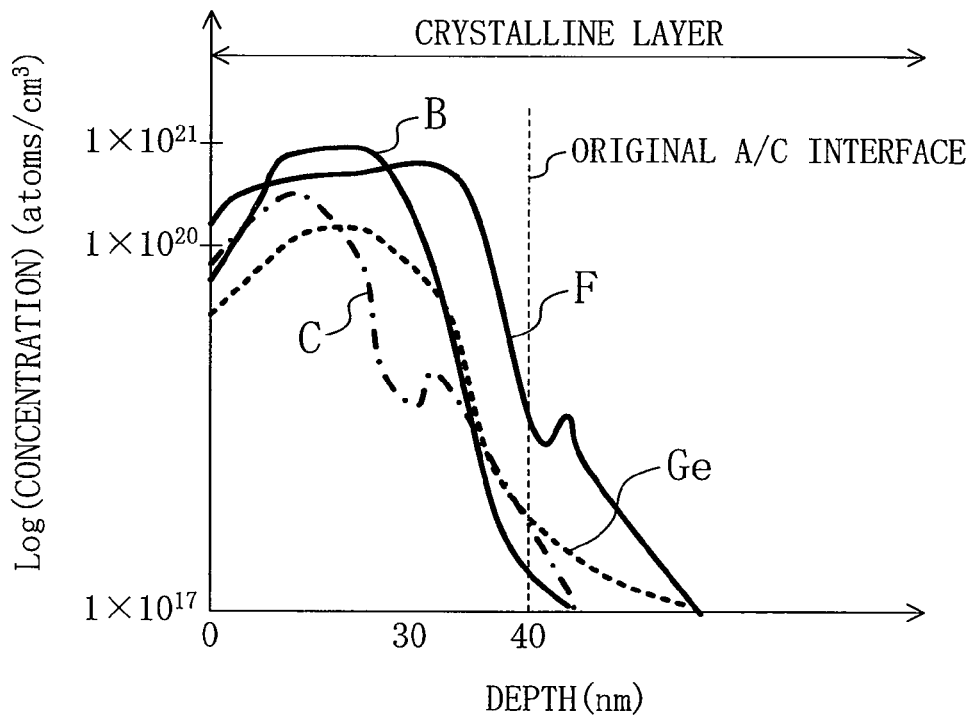

FIG. 8B shows concentration distributions in the depth direction of impurities in the P-type source and drain diffusion layers 113 after annealing is performed for activation while the first sidewall 108B is removed (logarithmic scale). As shown in FIG. 8B, fluorine is diffused during annealing, so that its concentration distribution has a center in the vicinity of a concentration peak position as it was immediately after ion implantation, and a segregation in the vicinity of a position where the a/c interface was originally provided.

Thus, according to this variation, the semiconductor substrate 100 is subjected to amorphization and then carbon implantation, before ion implantation for forming an extension is performed. Moreover, by amorphization of the source and drain formation regions with fluorine, channeling during ion implantation can be suppressed, and impurity diffusion can also be suppressed. Thus, this variation is characterized in that different species ions are co-implanted into the extension formation regions and the source and drain formation regions.

Both fluorine and carbon have the effect of suppressing the Transient Enhanced Diffusion (TED) of impurities. By implanting carbon into the extension formation regions and fluorine into the source and drain formation regions via the sidewalls 108A and 108B as in this variation, fluorine is implanted only into the source and drain regions. Also, by performing annealing (third rapid thermal processing) after removal of the second sidewalls 108B provided farther outside than the gate electrode 102, it is possible to prevent fluorine from being diffused from the second sidewall 108B into the N-type channel diffusion layer 103 during thermal diffusion.

Although only the second sidewalls 108B are removed in this variation, fluorine atoms that have been implanted into an upper portion of the gate electrode 102 can be completely removed if the gate electrode 102 is provided by a gate-last process.

If carbon is implanted as an impurity for prevention of diffusion into the source and drain formation regions, the implanted carbon is likely to increase the junction leakage. Therefore, the junction leakage can be suppressed by using fluorine for the source and drain formation regions.

Also, if annealing is performed while a silicon oxide film including a native oxide film is covered with a silicon nitride film, significant dose loss of boron occurs, resulting in an increase in sheet resistance. By contrast, in this variation, since annealing is performed after removal of the second sidewalls 108B, the increase of the sheet resistance of the P-type source and drain diffusion layers 113 in a pFET can be suppressed.

Also, by removing the outer second sidewalls 108B, a width dimension of the sidewall itself is reduced. Therefore, when a stress liner film is deposited in a subsequent step (not shown), an influence of the stress liner film on a region immediately below the gate electrode 102 in the N-type channel diffusion layer 103 becomes significant, so that a distortion effect increases, resulting in an improvement in transistor drive capability.

As described above, by combining co-implantation with carbon and co-implantation with fluorine that satisfy the aforementioned implantation conditions, the low-resistant P-type extension high-concentration diffusion layer 106 which has a shallow junction and suppresses the junction leakage, and also suppresses the increase of the resistance due to dose loss, can be more reliably formed.

Second Embodiment

Hereinafter, a second illustrative embodiment will be described with reference to the drawings. A difference between the first and second embodiments will be described, referring to their fabrication methods.

FIGS. 9A to 9D and 10A to 10D are cross-sectional views showing a structure of a semiconductor device (MIS transistor) according to the second illustrative embodiment in the order in which major steps of a fabrication method thereof are performed.

Figure 9A:
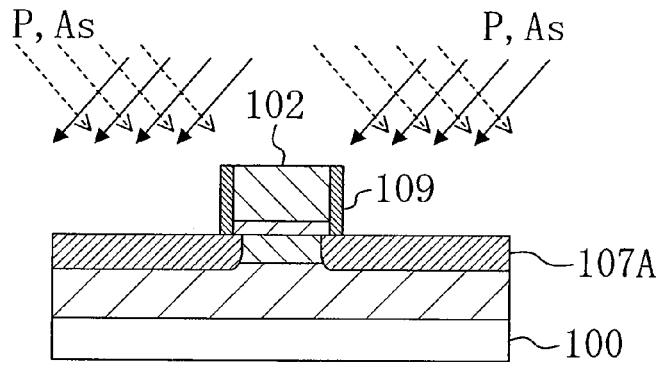
FIGS. 9A to 9D are cross-sectional views showing a method of fabrication of a semiconductor device according to a second illustrative embodiment in the order in which steps thereof are performed.

Initially, as shown in FIG. 9A, as in the first embodiment, an N-type impurity (e.g., phosphorus (P) ions) is implanted by angled implantation into a semiconductor substrate 100 at an implantation energy of about 50 keV and an implantation dose of about $2\times10^{13}/cm^2$ using offset spacers 109 and a gate electrode 102 as a mask. Next, an N-type impurity (e.g., arsenic (As) ions) is implanted by angled implantation at an implantation energy of about 80 keV and an implantation dose of about $1\times10^{13}/cm^2$, thereby forming N-type pocket impurity implanted layers 107A.

Figure 9B:
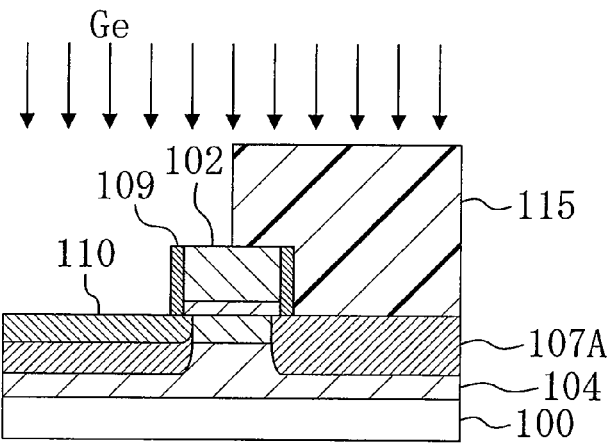

Next, as shown in FIG. 9B, a resist mask 115 is formed by lithography, covering one of source and drain formation regions (here, for example, the drain formation region) of the semiconductor substrate 100 while the other of the source and drain formation regions (here, for example, the source formation region) is kept open. Although the resist mask 115 covers only a half of the gate electrode 102 in FIG. 9B, the resist mask 115 may cover an entirety of the gate electrode 102. Next, germanium (Ge) ions are implanted into the semiconductor substrate 100 at an implantation energy of about 10 keV and an implantation dose of about $5\times10^{14}/cm^2$ using the resist mask 115, the offset spacers 109 and the gate electrode 102 as a mask, thereby selectively forming an amorphous layer 110 in the source formation region of the semiconductor substrate 100. Instead of germanium, the amorphous layer 110 may be formed using silicon (Si), argon (Ar), krypton (Kr), xenon (Xe), carbon (C) or the like.

Figure 9C:
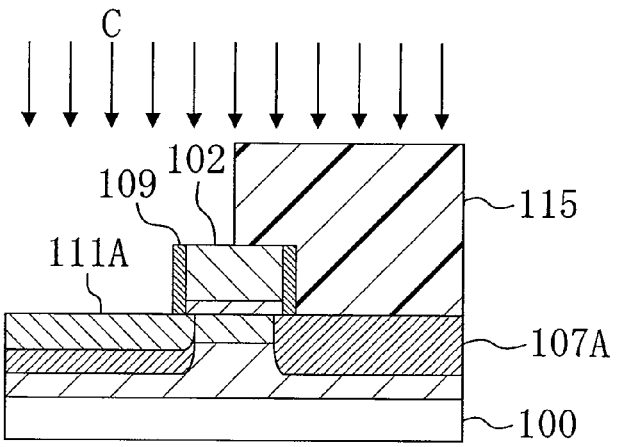

Next, as shown in FIG. 9C, in the presence of the amorphous layer 110 thus formed in the source formation region, carbon (C) ions are implanted into the semiconductor substrate 100 at an implantation energy of about 5 keV and an implantation dose of about $1\times10^{15}/cm^2$ using the resist mask 115, the offset spacers 109 and the gate electrode 102 as a mask, thereby forming a carbon implanted layer 111A in the source formation region. In this case, nitrogen ions may be used instead of carbon ions.

Figure 9D:
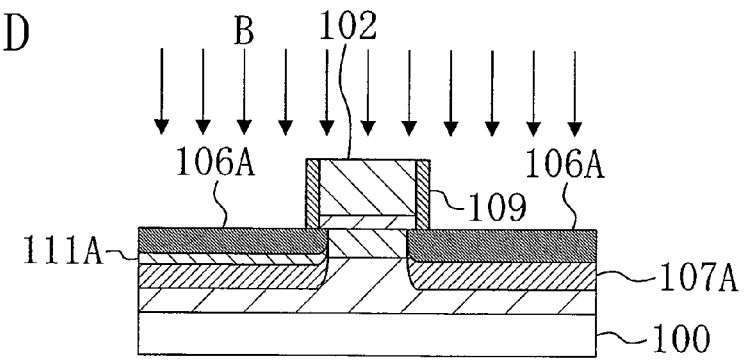

Next, as shown in FIG. 9D, after removal of the resist mask 115, a P-type impurity (e.g., boron (B) ions) is implanted into the semiconductor substrate 100 at an implantation energy of about 0.5 keV and an implantation dose of about $5\times10^{14}/cm^2$ using the offset spacers 109 and the gate electrode 102 as a mask, thereby forming a first P-type impurity implanted layer 106A in an upper portion of the carbon implanted layer 111A in the source formation region, and another first P-type impurity implanted layer 106A in an upper portion of the N-type pocket impurity implanted layer 107A in the drain formation region.

Figure 10A:
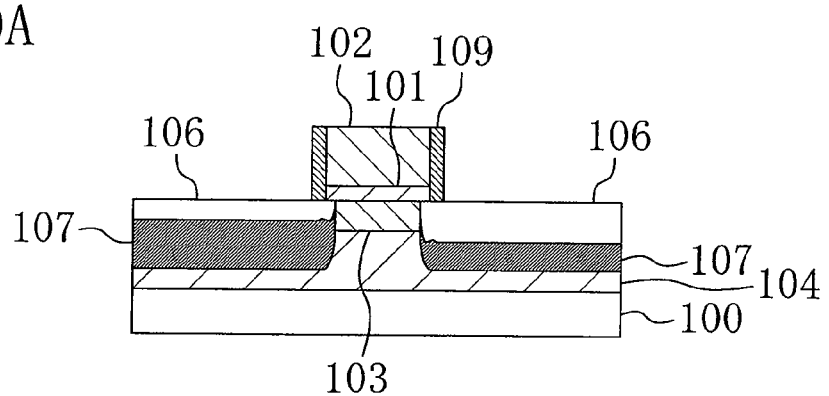
FIGS. 10A to 10D are cross-sectional views showing the method of fabrication of the semiconductor device of the second illustrative embodiment in the order in which steps thereof are performed.

Thereafter, as in the first embodiment, the temperature of the semiconductor substrate 100 is increased to about 1200° C. to 1350° C. by, for example, laser annealing, and is then maintained in the vicinity of the peak temperature for about 1 ms (second rapid thermal processing). By the second rapid thermal processing, as shown in FIG. 10A, boron ions are diffused into regions on both sides the gate electrode 102 of the semiconductor substrate 100, thereby forming P-type extension high-concentration diffusion layers 106 having relatively shallow junction surfaces, and N-type pocket diffusion layers 107 in which phosphorus ions and arsenic ions contained in the N-type pocket impurity implanted layers 107A are diffused. Instead of laser annealing, so-called millisecond annealing (MSA), such as flash lamp annealing or the like, may be used as the second rapid thermal processing of the order of milliseconds. Alternatively, as the second rapid thermal processing, the temperature of the semiconductor substrate 100 may be increased to about 850° C. to 1050° C. at a temperature increasing rate of about 200° C./s, and then the peak temperature may be maintained for a maximum of about 10 seconds, or may not be maintained (e.g., spike-RTA with low temperature).

Figure 10B:
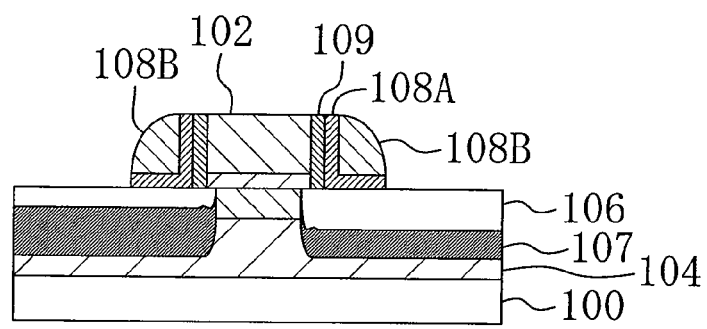

Next, as in the first embodiment, a first insulating film made of silicon oxide having a film thickness of about 10 nm and a second insulating film made of silicon nitride having a film thickness of about 40 nm are successively deposited on an entire surface of the semiconductor substrate 100, including the offset spacers 109 and the gate electrode 102, by, for example, Chemical Vapor Deposition (CVD). Thereafter, the deposited first and second insulating films are subjected to anisotropic etching, thereby forming first sidewalls 108A from the first insulating film and second sidewalls 108B from the second insulating film, on side surfaces in the gate length direction of the gate electrode 102, as shown in FIG. 10B. The second sidewalls 108B may be made of silicon oxide or a multilayer film made of silicon oxide and silicon nitride, instead of silicon nitride.

Figure 10C:
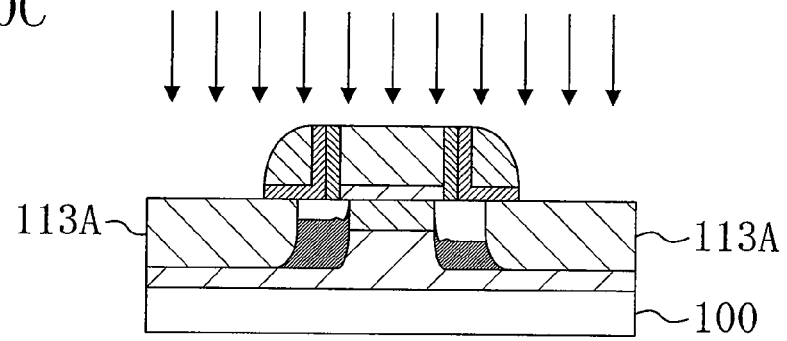

Next, as shown in FIG. 10C, boron ions (P-type impurity) are implanted into the semiconductor substrate 100 at an implantation energy of about 3 keV and an implantation dose of about $3\times10^{15}/cm^2$ using the gate electrode 102, the offset spacers 109, the first sidewalls 108A and the second sidewalls 108B as a mask, thereby forming second P-type impurity implanted layers 113A.

Figure 10D:
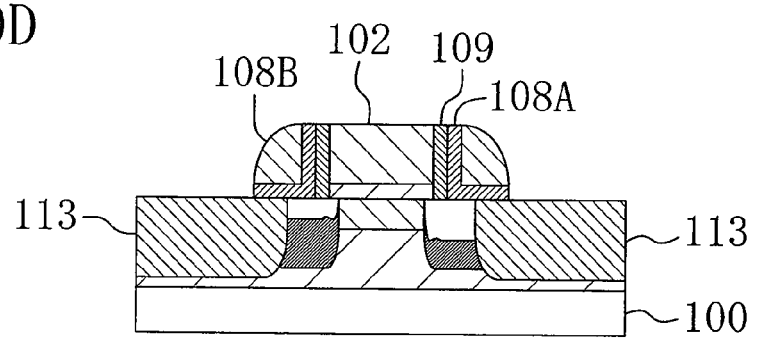

Next, as shown in FIG. 10D, the temperature of the semiconductor substrate 100 is increased to about 1200° C. to 1350° C. by, for example, laser annealing, and is then maintained in the vicinity of the peak temperature for about 1 ms (third rapid thermal processing). By the third rapid thermal processing, P-type source and drain diffusion layers 113 in which boron ions are diffused and which are connected to the respective P-type extension high-concentration diffusion layers 106 and have junction surfaces deeper than the respective P-type extension high-concentration diffusion layers 106 are formed in regions farther outside than the respective sidewalls 108A and 108B of the semiconductor substrate 100. Instead of laser annealing, so-called millisecond annealing (MSA), such as flash lamp annealing or the like, may be used as the third rapid thermal processing of the order of milliseconds. Alternatively, as the third rapid thermal processing, the temperature of the semiconductor substrate 100 may be increased to about 850° C. to 1050° C. at a temperature increasing rate of about 200° C./s to 250° C./s, and then the peak temperature may be maintained for a maximum of about 10 seconds, or may not be maintained (e.g., spike-RTA).

Note that, as in the variation of the first embodiment, fluorine (F) ions may be implanted as an impurity for prevention of diffusion into the source and drain formation regions before the step of FIG. 10C. Moreover, the third rapid thermal processing may be performed after removal of the second sidewalls 108B.

Thus, according to the second embodiment, for example, only the source formation region of the semiconductor substrate 100 is amorphized with germanium as shown in FIG. 9B, and thereafter, carbon ions are implanted only into the amorphized source formation region as shown in FIG. 9C, before the first P-type impurity implanted layers 106A are formed. As a result, TED in the P-type extension high-concentration diffusion layers 106 is suppressed only in the source formation region into which carbon has been implanted. Therefore, the P-type extension high-concentration diffusion layers 106 can have impurity profiles asymmetric about the gate electrode 102. Thus, by causing the source region to have a shallower and steeper extension profile than that of the drain region, a carrier concentration gradient between the source region and the channel region becomes significant, so that the drive capability of the MIS transistor is improved. Also, the drain region has a deeper extension profile than that of the source region, so that the occurrence of hot carriers can be suppressed as compared to a structure having symmetric, shallow and steep profiles.

Also, when fluorine for prevention of diffusion is implanted into the source and drain formation regions, the source and drain formation regions are amorphized, so that channeling during ion implantation is suppressed, and impurity diffusion is also suppressed.

Thus, according to the second embodiment, only the source formation region of the source and drain formation regions is subjected to co-implantation using the resist mask 115 to form asymmetric extension profiles.

Also, the second sidewalls 108B are removed before thermal diffusion by the third rapid thermal processing, so that fluorine can be prevented from being diffused from the second sidewalls 108B into the N-type channel diffusion layer 103 during thermal diffusion as described above.

As described above, by implanting carbon ions into the extension formation regions under the aforementioned implantation conditions, the low-resistant P-type extension high-concentration diffusion layers 106 which have shallow junctions and suppress the junction leakage, and also suppress the increase of the resistance due to dose loss, can be reliably formed.

Although arsenic ions are used as an impurity for the N-type channel diffusion layer 103 in the second embodiment, ions of an N-type element that have a larger mass than that of arsenic ions may be instead used. Alternatively, both arsenic ions and ions of an N-type element that have a larger mass than that of arsenic ions may be used.

Also, although a P-channel MIS transistor is used as a semiconductor device in the second embodiment, an N-channel MIS transistor may be instead used. In the case of the N-channel MIS transistor, arsenic (As) ions or ions of a Group V element, such as antimony (Sb) ions, bismuth (Bi) ions or the like, which have a larger mass than that of arsenic ions can be used as an N-type impurity ion for the extension high-concentration diffusion layer.

Also, only phosphorus (P) may be used for the N-type pocket diffusion layer 107. The use of phosphorus enhances the diffusion prevention effect of carbon ions as compared to when arsenic (As) is used.

Third Embodiment

Hereinafter, a third illustrative embodiment will be described with reference to the drawings. A difference between the second and third embodiments will be described, referring to their fabrication methods.

FIGS. 11A to 11D and 12A to 12D are cross-sectional views showing a structure of a semiconductor device (MIS transistor) according to the third illustrative embodiment in the order in which major steps of a fabrication method thereof are performed.

Figure 11A:
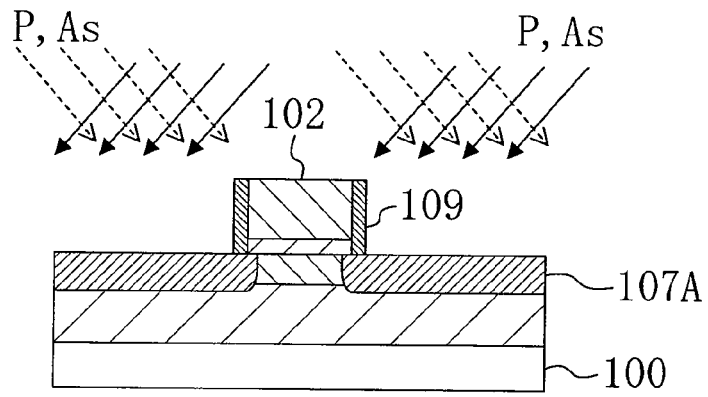
FIGS. 11A to 11D are cross-sectional views showing a method of fabrication of a semiconductor device according to a third illustrative embodiment in the order in which steps thereof are performed.

Initially, as shown in FIG. 11A, as in the first embodiment, an N-type impurity (e.g., phosphorus (P) ions) is implanted by angled implantation into a semiconductor substrate 100 at an implantation energy of about 50 keV and an implantation dose of about $2\times10^{13}/cm^2$ using offset spacers 109 and a gate electrode 102 as a mask. Next, an N-type impurity (e.g., arsenic (As) ions) is implanted by angled implantation at an implantation energy of about 80 keV and an implantation dose of about $1\times10^{13}/cm^2$, thereby forming N-type pocket impurity implanted layers 107A.

Figure 11B:
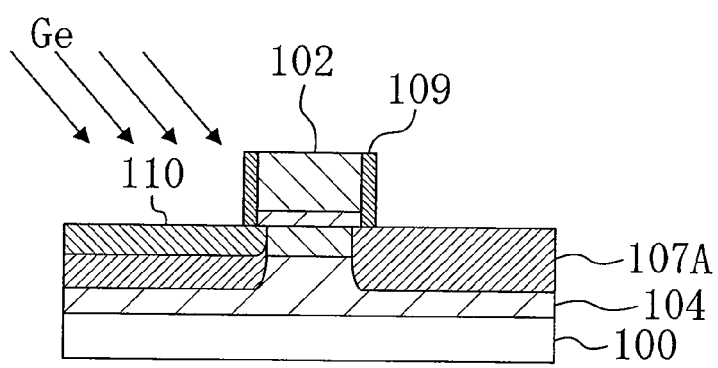

Next, as shown in FIG. 11B, germanium (Ge) ions are implanted into the semiconductor substrate 100 by angled implantation at a tilt angle of about 25° from the normal to a main surface of the semiconductor substrate 100 toward, for example, a source formation region, at an implantation energy of about 10 keV and an implantation dose of about $5\times10^{14}/cm^2$ using the offset spacers 109 and the gate electrode 102 as a mask, thereby selectively forming an amorphous layer 110 in the source formation region of the semiconductor substrate 100. Instead of germanium, the amorphous layer 110 may be formed using silicon (Si), argon (Ar), krypton (Kr), xenon (Xe), carbon (C) or the like.

Figure 11C:
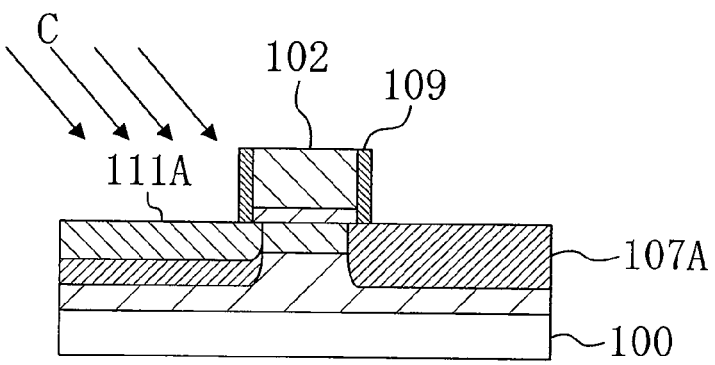

Next, as shown in FIG. 11C, in the presence of the amorphous layer 110 thus formed in the source formation region, carbon (C) ions are implanted by angled implantation at a tilt angle of about 25° from the normal to the main surface of the semiconductor substrate 100 toward, for example, the source formation region, at an implantation energy of about 5 keV and an implantation dose of about $1\times10^{15}/cm^2$ using the offset spacers 109 and the gate electrode 102 as a mask, thereby forming a carbon implanted layer 111A in the source formation region. In this case, nitrogen ions may be used instead of carbon ions.

Figure 11D:
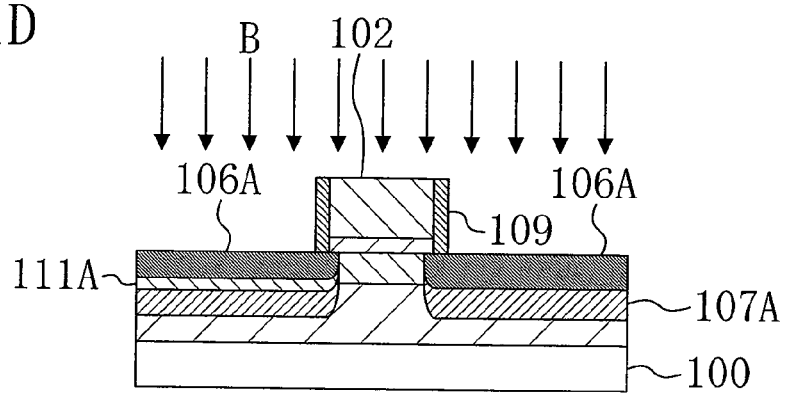

Next, as shown in FIG. 11D, as in the second embodiment, a P-type impurity (e.g., boron (B) ions) is implanted into the semiconductor substrate 100 at an implantation energy of about 0.5 keV and an implantation dose of about $5\times10^{14}/cm^2$ using the offset spacers 109 and the gate electrode 102 as a mask, thereby forming a first P-type impurity implanted layer 106A in an upper portion of the carbon implanted layer 111A in the source formation region, and another first P-type impurity implanted layer 106A in an upper portion of the N-type pocket impurity implanted layer 107A in the drain formation region.

Figure 12A:
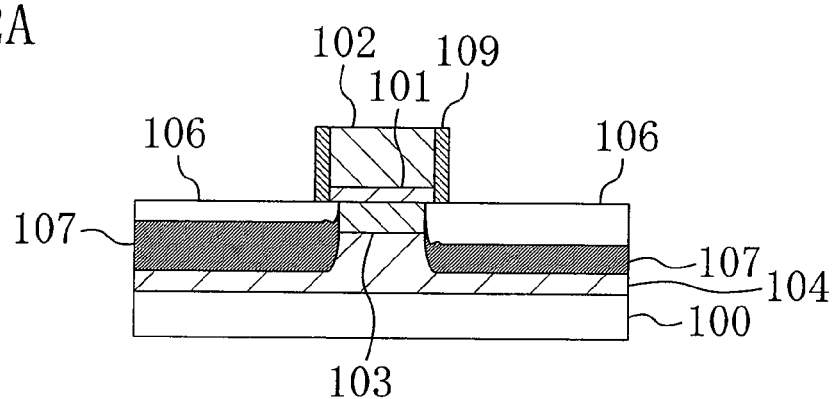
FIGS. 12A to 12D are cross-sectional views showing the method of fabrication of the semiconductor device of the third illustrative embodiment in the order in which steps thereof are performed.

Next, as shown in FIG. 12A, the temperature of the semiconductor substrate 100 is increased to about 1200° C. to 1350° C. by, for example, laser annealing, and is then maintained in the vicinity of the peak temperature for about 1 ms (second rapid thermal processing). By the second rapid thermal processing, P-type extension high-concentration diffusion layers 106 in which boron ions are diffused and which have relatively shallow junction surfaces, and N-type pocket diffusion layers 107 in which phosphorus ions and arsenic ions contained in the respective N-type pocket impurity implanted layers 107A are diffused, are formed in regions on both sides of the gate electrode 102 of the semiconductor substrate 100. Instead of laser annealing, so-called millisecond annealing (MSA), such as flash lamp annealing or the like, may be used as the second rapid thermal processing of the order of milliseconds. Alternatively, as the second rapid thermal processing, the temperature of the semiconductor substrate 100 may be increased to about 850° C. to 1050° C. at a temperature increasing rate of about 200° C./s, and then the peak temperature may be maintained for a maximum of about 10 seconds, or may not be maintained (e.g., spike-RTA with low temperature).

Figure 12B:
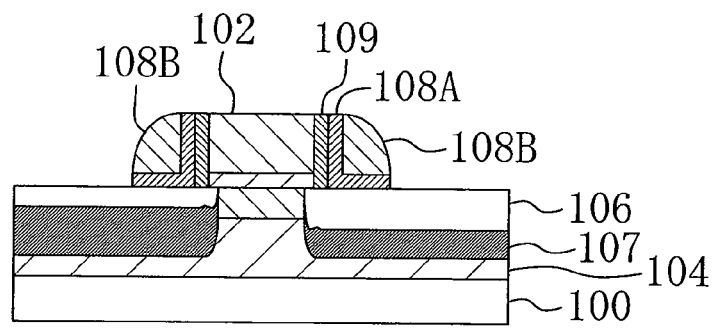

Next, a first insulating film made of silicon oxide having a film thickness of about 10 nm and a second insulating film made of silicon nitride having a film thickness of about 40 nm are successively deposited on an entire surface of the semiconductor substrate 100, including the offset spacers 109 and the gate electrode 102, by, for example, Chemical Vapor Deposition (CVD). Thereafter, the deposited first and second insulating films are subjected to anisotropic etching, thereby forming first sidewalls 108A from the first insulating film and second sidewalls 108B from the second insulating film, on side surfaces in the gate length direction of the gate electrode 102, as shown in FIG. 12B. The second sidewalls 108B may be made of silicon oxide or a multilayer film made of silicon oxide and silicon nitride, instead of silicon nitride.

Figure 12C:
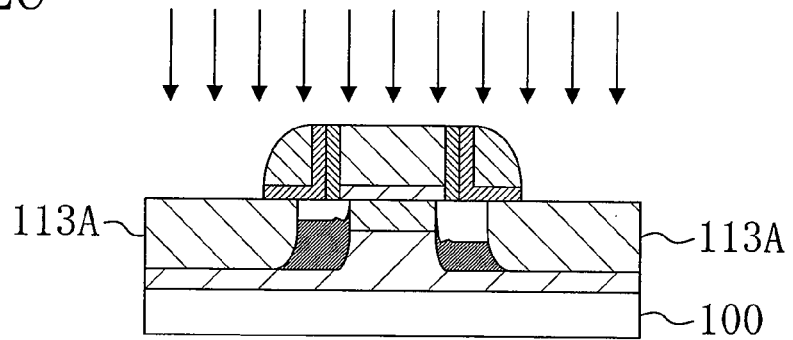

Next, as shown in FIG. 12C, boron ions (P-type impurity) are implanted into the semiconductor substrate 100 at an implantation energy of about 3 keV and an implantation dose of about $3\times10^{15}/cm^2$ using the gate electrode 102, the offset spacers 109, the first sidewalls 108A and the second sidewalls 108B as a mask, thereby forming second P-type impurity implanted layers 113A.

Figure 12D:
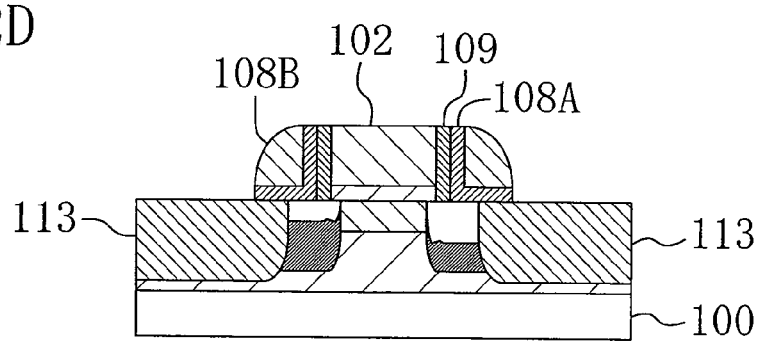
Figure 13A:
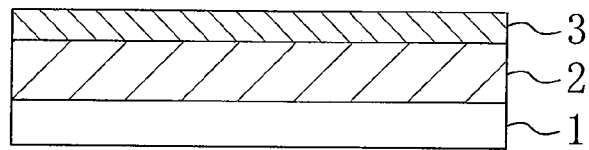
FIGS. 13A to 13D are cross-sectional views showing a method of fabrication of a conventional semiconductor device in the order in which steps thereof are performed.
Figure 13B:
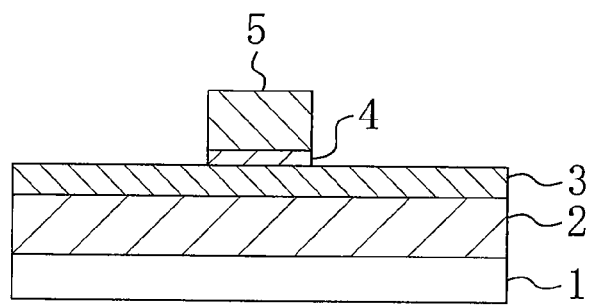
Figure 13C:
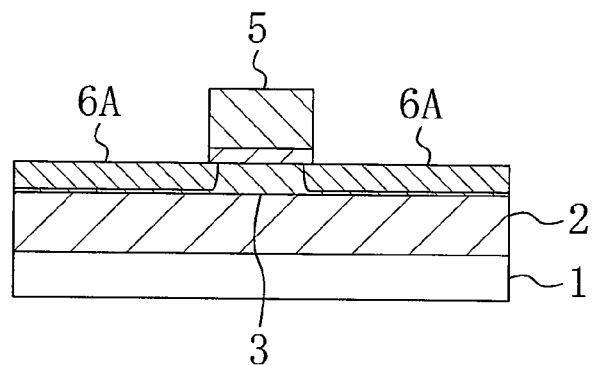
Figure 13D:
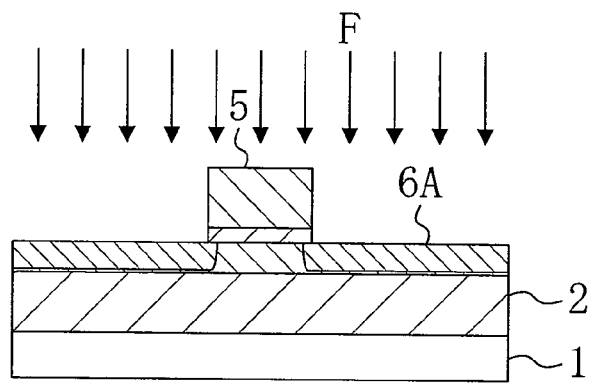
Figure 14A:
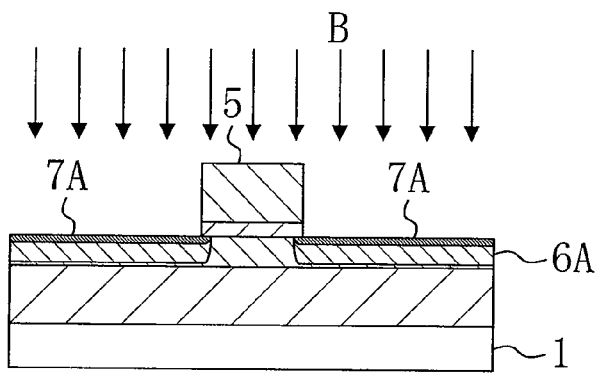
FIGS. 14A to 14D are cross-sectional views showing the method of fabrication of the conventional semiconductor device in the order in which steps thereof are performed.
Figure 14B:
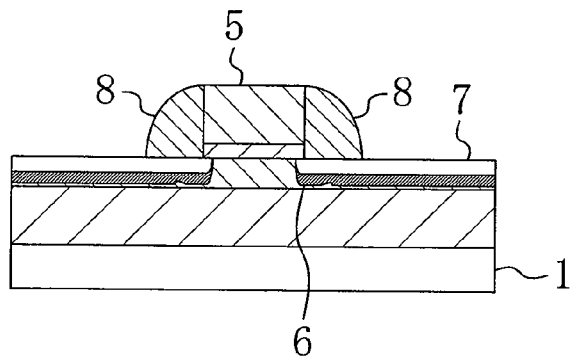
Figure 14C:
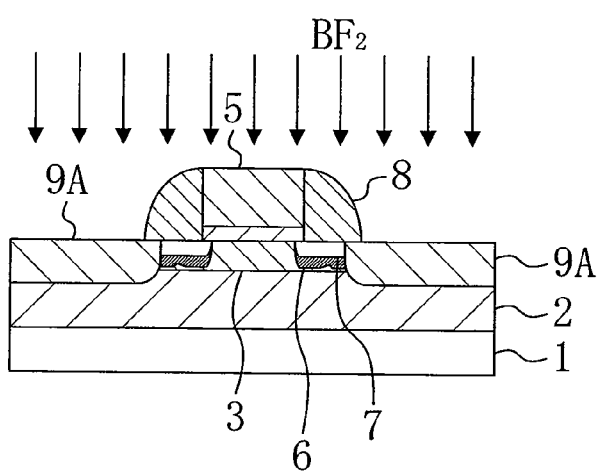
Figure 14D:
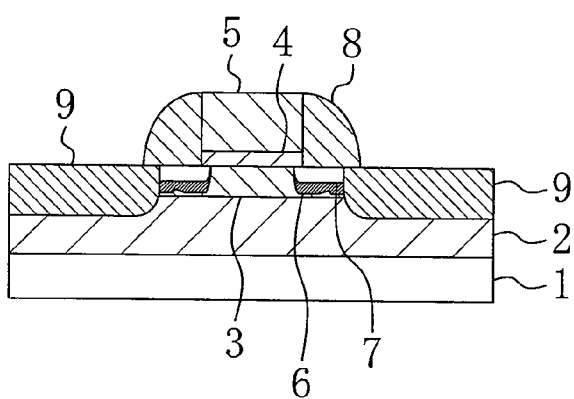

Next, as shown in FIG. 12D, the temperature of the semiconductor substrate 100 is increased to about 1200° C. to 1350° C. by, for example, laser annealing, and is then maintained in the vicinity of the peak temperature for about 1 ms (third rapid thermal processing). By the third rapid thermal processing, P-type source and drain diffusion layers 113 in which boron ions are diffused and which are connected to the respective P-type extension high-concentration diffusion layers 106 and have junction surfaces deeper than the respective P-type extension high-concentration diffusion layers 106, are formed in respective regions directly below and farther outside than the sidewalls 108A and 108B of the semiconductor substrate 100. Instead of laser annealing, so-called millisecond annealing (MSA), such as flash lamp annealing or the like, may be used as the third rapid thermal processing of the order of milliseconds. Alternatively, as the third rapid thermal processing, the temperature of the semiconductor substrate 100 may be increased to about 850° C. to 1050° C. at a temperature increasing rate of about 200° C./s to 250° C./s, and then the peak temperature may be maintained for a maximum of about 10 seconds, or may not be maintained (e.g., spike-RTA).

Note that, as in the variation of the first embodiment, fluorine (F) ions as an impurity for prevention of diffusion may be implanted into the source and drain formation regions before the step of FIG. 12C. Moreover, the third rapid thermal processing may be performed after removal of the second sidewalls 108B.

Thus, according to the third embodiment, for example, only the source formation region of the semiconductor substrate 100 is amorphized with germanium as shown in FIG. 11B, and thereafter, carbon ions are implanted only into the amorphized source formation region as shown in FIG. 11C, before the first P-type impurity implanted layers 106A are formed. As a result, TED in the P-type extension high-concentration diffusion layers 106 is suppressed only in the source formation region into which carbon has been implanted. Therefore, the P-type extension high-concentration diffusion layers 106 can have impurity profiles asymmetric about the gate electrode 102. Thus, by causing the source region to have a shallower and steeper extension profile than that of the drain region, a carrier concentration gradient between the source region and the channel region becomes significant, so that the drive capability of the MIS transistor is improved. Also, the drain region has a deeper extension profile than that of the source region, so that the occurrence of hot carriers can be suppressed as compared to a structure having symmetric, shallow and steep profiles.

Also, when fluorine for prevention of diffusion is implanted into the source and drain formation regions, the source and drain formation regions are amorphized, so that channeling during ion implantation is suppressed, and impurity diffusion is also suppressed.

Thus, according to the third embodiment, only the source formation region of the source and drain formation regions is subjected to co-implantation using angled implantation to form asymmetric extension profiles.

Also, the second sidewalls 108B are removed before thermal diffusion by the third rapid thermal processing, so that fluorine can be prevented from being diffused from the second sidewalls 108B into the N-type channel diffusion layer 103 during thermal diffusion as described above.

As described above, by implanting carbon ions into the extension formation regions under the aforementioned implantation conditions, the low-resistant P-type extension high-concentration diffusion layers 106 which have shallow junctions and suppress the junction leakage, and also suppress the increase of the resistance due to dose loss, can be reliably formed.

Although arsenic ions are used as an impurity for the N-type channel diffusion layer 103 in the third embodiment, ions of an N-type element that have a larger mass than that of arsenic ions may be instead used. Alternatively, both arsenic ions and ions of an N-type element that have a larger mass than that of arsenic ions may be used.

Also, although a P-channel MIS transistor is used as a semiconductor device in the third embodiment, an N-channel MIS transistor may be instead used. In the case of the N-channel MIS transistor, arsenic (As) ions or ions of a Group V element, such as antimony (Sb) ions, bismuth (Bi) ions or the like, which have a larger mass than that of arsenic ions can be used as an N-type impurity ion for the extension high-concentration diffusion layer.

Also, only phosphorus (P) may be used for the N-type pocket diffusion layer 107. The use of phosphorus enhances the diffusion prevention effect of carbon ions as compared to when arsenic (As) is used.

Although only the source formation region is subjected to co-implantation in the second and third embodiments, only the drain formation region may be subjected to co-implantation. In other words, only either of the source and drain formation regions may be subjected to co-implantation.

As described above, the semiconductor device of the present disclosure and the method of fabrication thereof can achieve an extension diffusion layer having a shallower junction and a lower resistance that is required for further miniaturization, and are useful for a MIS semiconductor device having high drive capability and a method of fabrication thereof, and the like.

What is claimed is:

1. A semiconductor device comprising:
   a gate electrode provided on a semiconductor region with a gate insulating film being interposed therebetween;
   extension diffusion layers provided in regions on both sides of the gate electrode of the semiconductor region, a first-conductivity type first impurity being diffused in the extension diffusion layers;
   source and drain diffusion layers provided in regions farther outside than the respective extension diffusion layers of the semiconductor region and having junction depths deeper than the respective extension diffusion layers; and
   insulating offset spacers provided on the sides of the gate electrode,
   wherein at least one of the extension diffusion layers and one of the insulating offset spacers on both sides of the gate electrode contains carbon,
   the source and drain diffusion layers contain fluorine and the carbon, and
   a junction depth of the fluorine is deeper than a junction depth of the carbon in the source and drain diffusion layers.

2. The semiconductor device of claim 1, wherein the carbon is added to only one of the extension diffusion layers.

3. The semiconductor device of claim 1, wherein the carbon is added to both of the extension diffusion layers.

4. The semiconductor device of claim 1, wherein the offset spacers do not contain fluorine.

5. The semiconductor device of claim 1, wherein germanium remains in the source and drain diffusion layers.

6. The semiconductor device of claim 5, wherein
   the germanium remains in the extension diffusion layers, and
   a junction depth of the germanium in the extension diffusion layers is substantially the same as a junction depth of the germanium in the source and drain diffusion layers.

7. The semiconductor device of claim 1, wherein a segregation of the carbon is formed near and immediately below the extension diffusion layer.

8. The semiconductor device of claim 1, wherein a junction depth of the carbon is deeper than a junction depth of the extension diffusion layer.

9. The semiconductor device of claim 1, wherein a segregation of the fluorine is formed near and immediately below the source and drain diffusion layers.

10. The semiconductor device of claim 1, wherein a residual (EOR) defect is not present near and immediately below the extension diffusion layer.

11. A semiconductor device comprising:
    a gate electrode provided on a semiconductor region with a gate insulating film being interposed therebetween;
    extension diffusion layers provided in regions on both sides of the gate electrode of the semiconductor region, a first-conductivity type first impurity being diffused in the extension diffusion layers; and
    source and drain diffusion layers provided in regions farther outside than the respective extension diffusion layers of the semiconductor region and having junction depths deeper than the respective extension diffusion layers,
    wherein only one of the extension diffusion layers on both sides of the gate electrode contains carbon.

12. The semiconductor device of claim 11, wherein the source and drain diffusion layers contain fluorine.

13. The semiconductor device of claim 11, wherein insulating offset spacers are provided on the sides of the gate electrode, and the offset spacers do not contain fluorine.

14. The semiconductor device of claim 13, wherein the offset spacer on the one of the extension diffusion layers containing carbon contains carbon.

15. The semiconductor device of claim 14, wherein insulating sidewalls are provided on side surfaces in a gate length direction of the gate electrode with the respective offset spacers being interposed therebetween, and the sidewalls do not contain fluorine.

16. The semiconductor device of claim 11, wherein germanium remains in the source and drain diffusion layers.

* * * * *